United States Patent
Lin et al.

(10) Patent No.: US 9,691,766 B1
(45) Date of Patent: Jun. 27, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Jia-Ming Lin, Tainan (TW); Chun Che Lin, Tainan (TW); Shiu-Ko JangJian, Tainan (TW); Wei Ken Lin, Tainan (TW); Kuang Yao Lo, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/088,117

(22) Filed: Apr. 1, 2016

(51) Int. Cl.
| | |
|---|---|
| *H01L 27/088* | (2006.01) |
| *H01L 21/8234* | (2006.01) |
| *H01L 21/3105* | (2006.01) |
| *H01L 21/311* | (2006.01) |
| *H01L 21/3115* | (2006.01) |
| *H01L 29/06* | (2006.01) |
| *H01L 29/66* | (2006.01) |

(52) U.S. Cl.
CPC .... *H01L 27/0886* (2013.01); *H01L 21/31055* (2013.01); *H01L 21/31111* (2013.01); *H01L 21/31155* (2013.01); *H01L 21/823431* (2013.01); *H01L 21/823481* (2013.01); *H01L 29/0649* (2013.01); *H01L 29/66545* (2013.01)

(58) Field of Classification Search
CPC .................................................. H01L 27/0886
See application file for complete search history.

(56) References Cited

U.S. PATENT DOCUMENTS

2016/0343623 A1\* 11/2016 Fogel .............. H01L 21/823878

\* cited by examiner

*Primary Examiner* — Marc Armand
(74) *Attorney, Agent, or Firm* — Jianq Chyun IP Office

(57) ABSTRACT

A fin field effect transistor (FinFET) including a substrate, a plurality of insulators, and a gate stack is provided. The substrate includes a plurality of trenches and at least one semiconductor fin between the trenches. The insulators are disposed in the trenches and include doped regions distributed therein. The gate stack partially covers the at least one semiconductor fin and the insulators. A method for fabricating the aforesaid FinFET is also discussed.

13 Claims, 27 Drawing Sheets

FIN FIELD EFFECT TRANSISTOR AND METHOD FOR FABRICATING THE SAME

BACKGROUND

As the semiconductor devices keep scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the semiconductor fin further provides a better electrical control over the channel.

Currently, the cross-sectional profile of the semiconductor fins in FinFETs may affect the performance of FinFETs enormously. The semiconductor fins may be consumed or damaged by an etching step of shallow trench isolation (STI) process, when the etching condition is too aggressive for the semiconductor fins. Furthermore, in the proximity of the boundary between dense area and isolated area, the cross-sectional profile of the semiconductor fins may be asymmetric or uneven due to loading effect.

BRIEF DESCRIPTION OF THE DRAWINGS

The aspects of the present disclosure are best understood from the following detailed description when read with the accompanying figures. It is noted that, in accordance with the standard practice in the industry, various features are not drawn to scale; in fact, the dimensions of these features may be arbitrarily increased or reduced for clarity of discussion.

DETAILED DESCRIPTION

Figure 1:
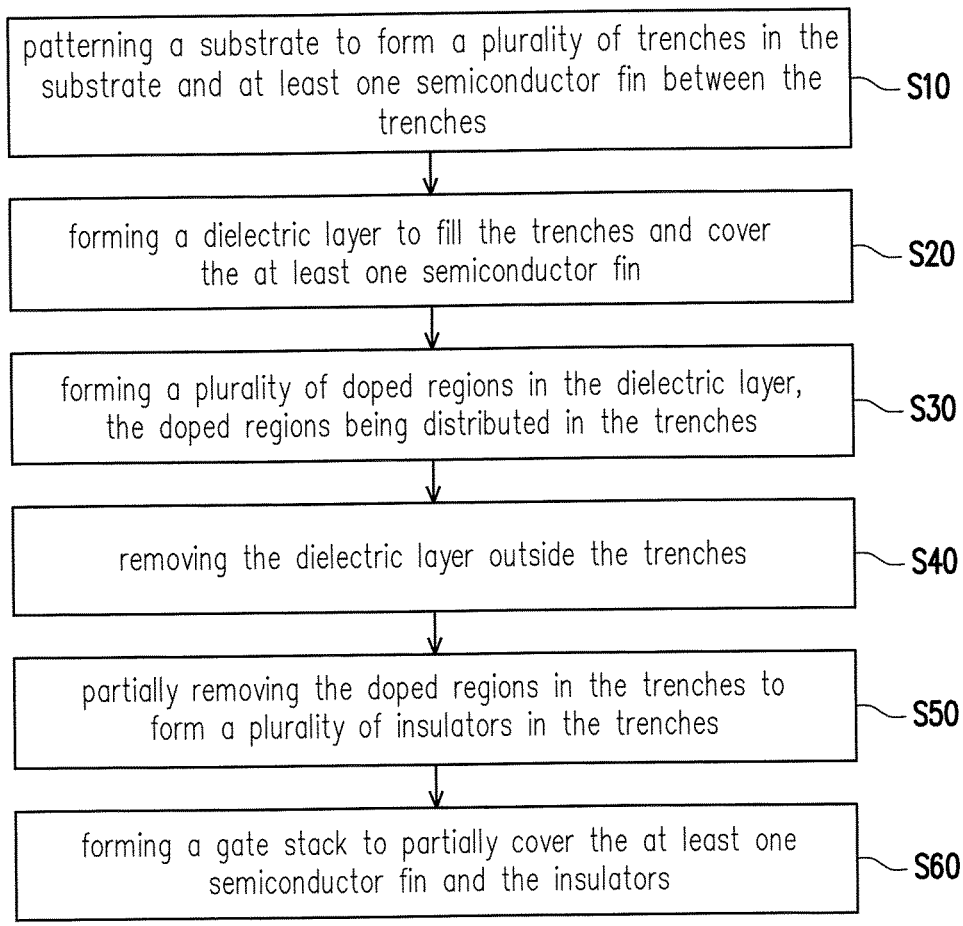
FIG. 1 illustrates a flow chart illustrating a method for fabricating a FinFET in accordance with some embodiments of the present disclosure.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include the embodiments in which the first and second features are formed in direct contact, and may also include the embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for the ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of FinFETs. The FinFETs may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes, or the like. The embodiments are not limited in this context.

FIG. 1 illustrates a flow chart illustrating a method for fabricating a FinFET in accordance with some embodiments of the present disclosure. Referring to FIG. 1, the method at least includes step S10, step S20, step S30, step S40, step S50 and step S60. First, in step S10, a substrate is patterned to form a plurality of trenches in the substrate and at least one semiconductor fin between the trenches. Then, in step S20, a dielectric layer is formed to fill the trenches and cover the at least one semiconductor fin. In step S30, a plurality of doped regions are formed in the dielectric layer and the doped regions are distributed in the trenches. In step S40, the dielectric layer outside the trenches is removed. In step S50, the doped regions in the trenches are partially removed to form a plurality of insulators in the trenches. Thereafter, in step S60, a gate stack is formed to partially cover the at least one semiconductor fin and the insulators.

It is noted that the sequence of the above-mentioned step S30 and step S40 is not limited. In some embodiments, step S30 may be performed before step S40; in alternative embodiments, step S30 may be performed after step S40. In yet alternative embodiments, some of the doped regions may be formed in the dielectric layer before step S40 is performed while the rest of the doped regions may be formed in the dielectric layer after step S40 is performed.

Figure 2A:
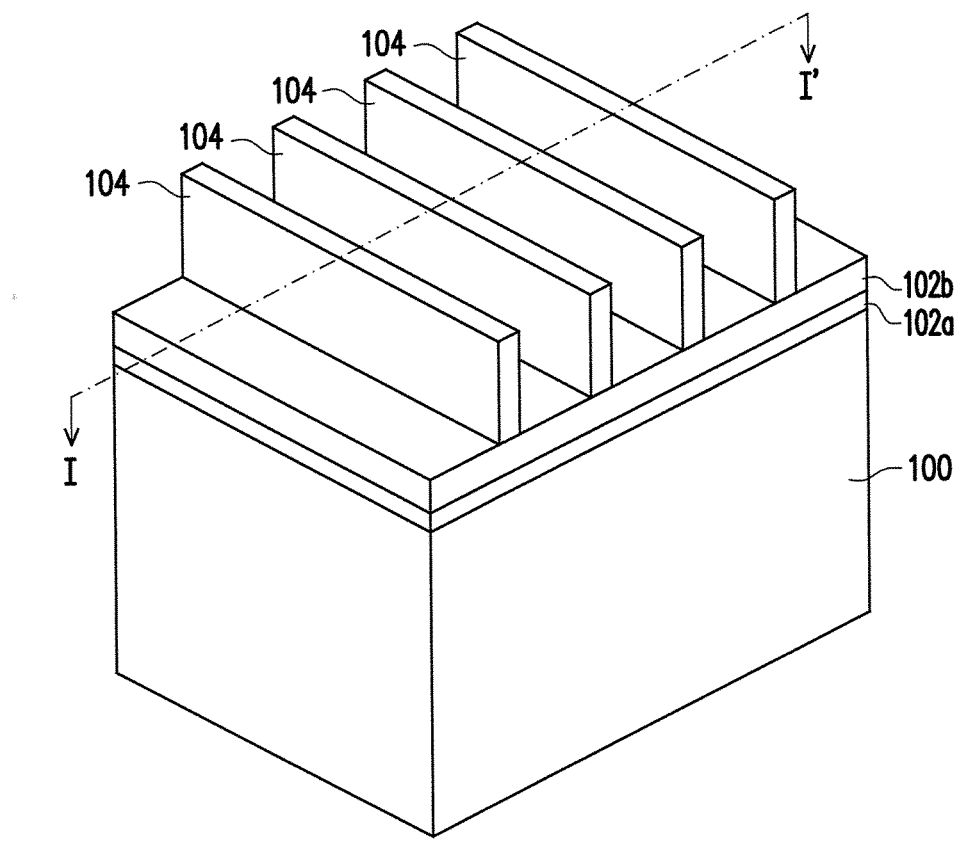
FIG. 2A through FIG. 2K are the perspective views of a method for fabricating a FinFET in accordance with some embodiments of the present disclosure.
Figure 3A:
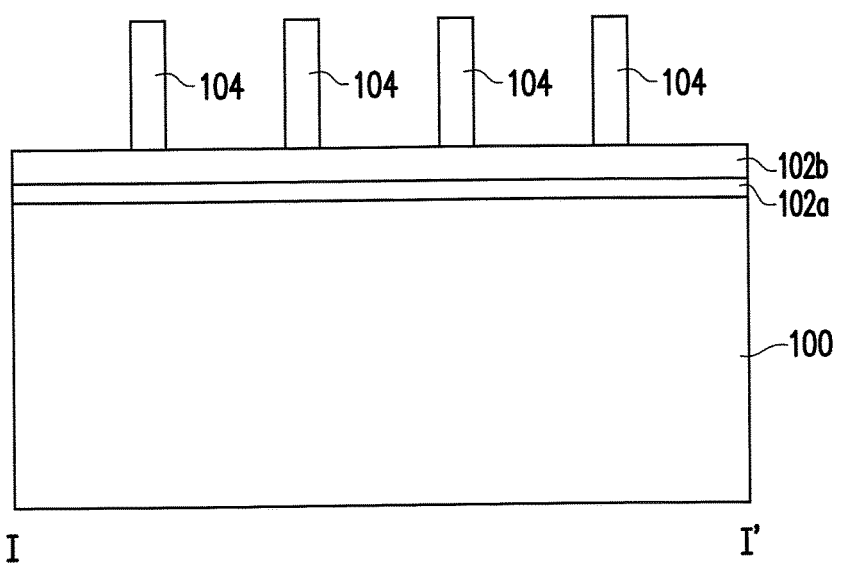
FIG. 3A through FIG. 3K are the cross-sectional views of a method for fabricating a FinFET in accordance with some embodiments of the present disclosure.

FIG. 2A is a perspective view of the FinFET at one of various stages of the manufacturing method, and FIG. 3A is a cross-sectional view of the FinFET taken along the cross-sectional line I-I' of FIG. 2A. In Step S10 in FIG. 1 and as shown in FIG. 2A and FIG. 3A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET. Alternatively, the doped regions may be configured for a p-type FinFET. In some alternative embodiments, the substrate 100 may be made of some other suitable semiconductors of different elements, such as carbon (e.g., diamond) or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a protective layer 102a and a hard mask layer 102b are sequentially formed on the substrate 100. The protective layer 102a may be a silicon oxide thin film formed, for example, by thermal oxidation process. The protective layer 102a may act as an adhesion layer between the substrate 100 and hard mask layer 102b. The protective layer 102a may also act as an etch stop layer for etching the hard mask layer 102b. In at least one embodiment, the hard mask layer 102b is a silicon nitride layer formed, for example, by low-pressure chemical vapor deposition (LP-CVD) or plasma enhanced chemical vapor deposition (PECVD). A patterned photoresist layer 104 having a predetermined pattern is formed on the hard mask layer 102b.

Figure 2B:
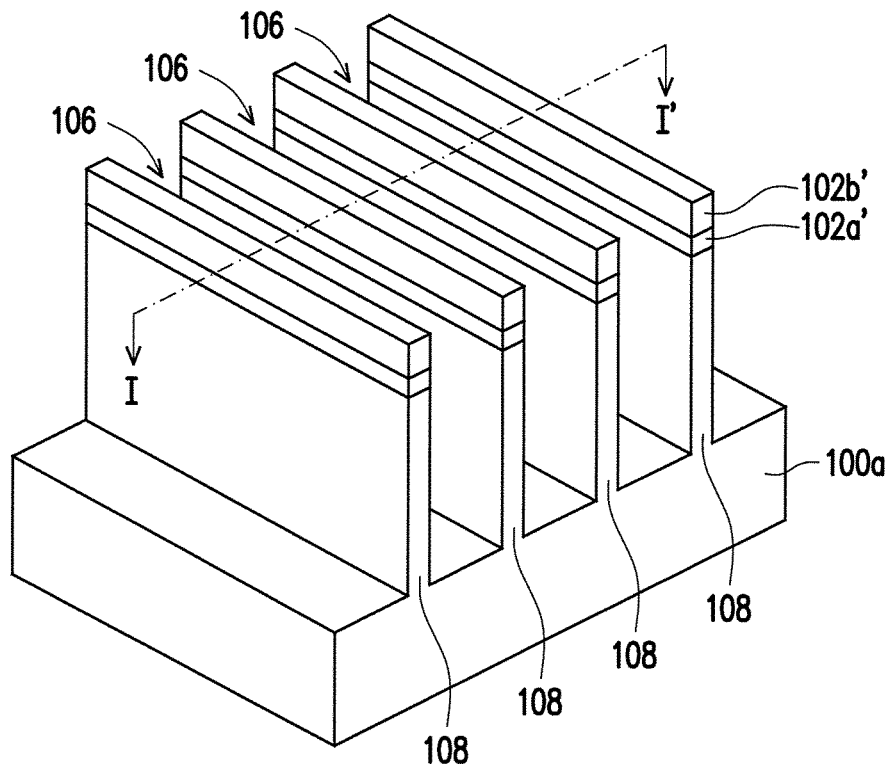
Figure 3B:
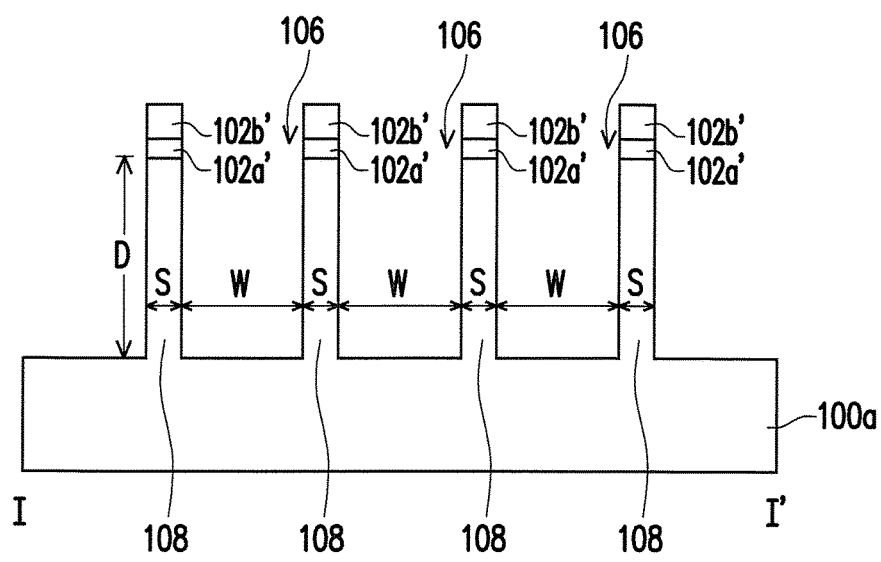
Figure 2C:
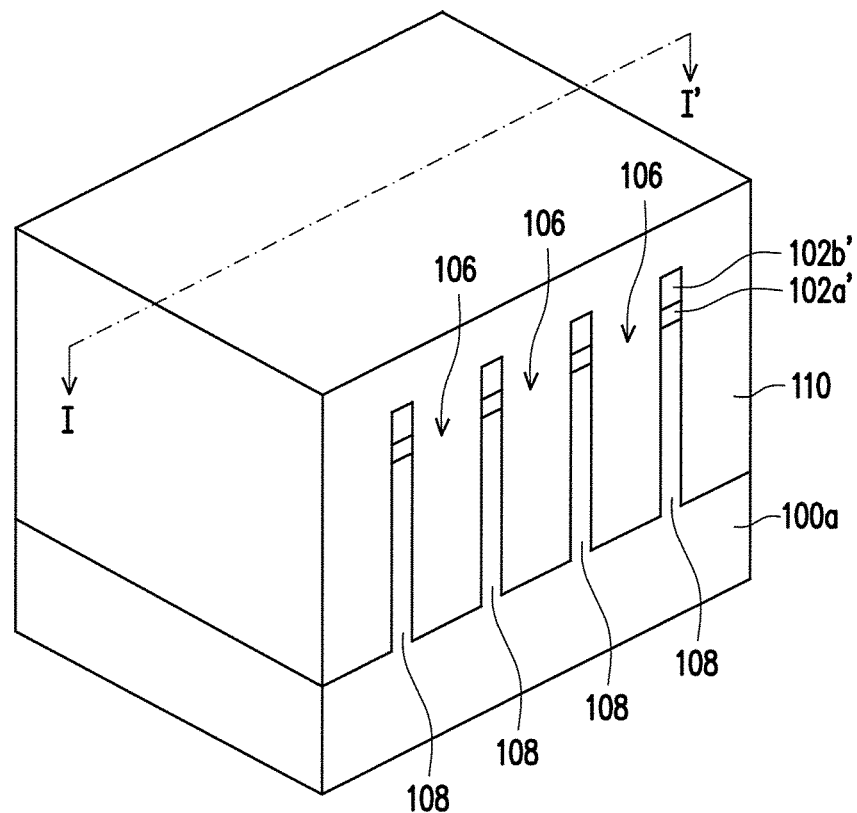
Figure 3C:
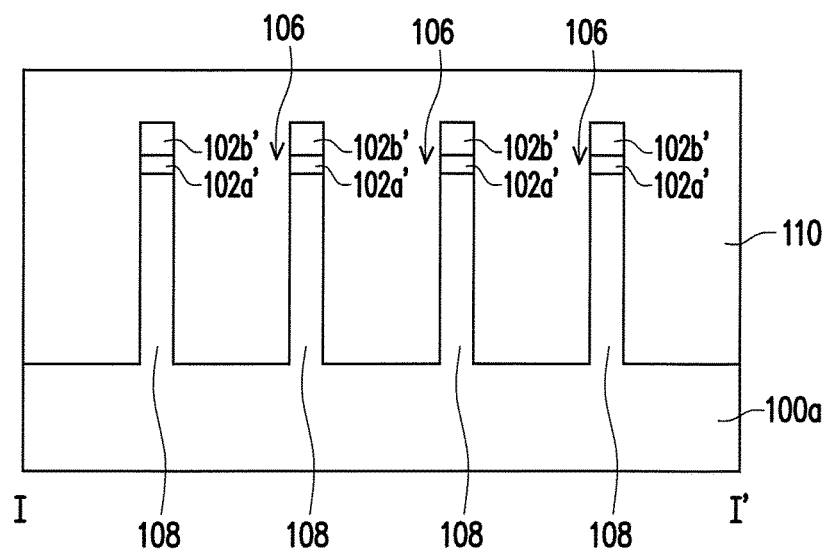

FIG. 2B is a perspective view of the FinFET at one of various stages of the manufacturing method, and FIG. 3B is a cross-sectional view of the FinFET taken along the cross-sectional line I-I' of FIG. 2B. In Step S10 in FIG. 1 and as shown in FIG. 2A to FIG. 2B and FIG. 3A to FIG. 3B, the hard mask layer 102b and the protective layer 102a, which are not covered by the patterned photoresist layer 104, are sequentially etched to form a patterned hard mask layer 102b' and a patterned protective layer 102a' so as to expose underlying substrate 100. By using the patterned hard mask layer 102b', the patterned protective layer 102a', and the patterned photoresist layer 104 as a mask, portions of the substrate 100 are exposed and etched to form trenches 106 and semiconductor fins 108. The semiconductor fins 108 are substantially parallel to one another. The number of the semiconductor fins 108 shown in FIG. 2C and FIG. 3C is merely for illustration; in some alternative embodiments, at least one semiconductor fin (e.g., one, two, three or more than four) may be formed in accordance with the actual design requirements. The semiconductor fins 108 are covered by the patterned hard mask layer 102b', the patterned protective layer 102a' and the patterned photoresist layer 104. Two adjacent trenches 106 are spaced apart by a spacing S. For example, the spacing S between two adjacent trenches 106 ranges from about 20 nm to about 25 nm. In other words, two adjacent trenches 106 are spaced apart by one of the semiconductor fins 108 correspondingly and the width of the semiconductor fins 108 is the same with the spacing S.

In some embodiments, the width W of the trenches 106 ranges from about 20 nm to about 48 nm. The height of the semiconductor fins 108 and the depth D of the trenches 106 range from about 40 nm to about 70 nm, for example. After the trenches 106 and the semiconductor fins 108 are formed, the patterned photoresist layer 104 is then removed. In one embodiment, a cleaning process may be performed to remove a native oxide of the semiconductor substrate 100a and the semiconductor fins 108. The cleaning process may be performed using diluted hydrofluoric (DHF) acid or other suitable cleaning solutions.

FIG. 2C is a perspective view of the FinFET at one of various stages of the manufacturing method and FIG. 3C is a cross-sectional view of the FinFET taken along the cross-sectional line I-I' of FIG. 2C. In Step S20 in FIG. 1 and as shown in FIG. 2B to FIG. 2C and FIG. 3B to FIG. 3C, after the trenches 106 and the semiconductor fins 108 are formed, a dielectric layer 110 is then formed over the substrate 100a to fill up the trenches 106 and covers the semiconductor fins 108. In addition to the semiconductor fins 108, the dielectric layer 110 further covers the patterned pad layer 102a' and the patterned hard mask layer 102b'. The dielectric layer 110 may include silicon oxide, silicon nitride, silicon oxynitride, a spin-on dielectric material, or a low-K dielectric material. The dielectric layer 110 may be formed by high-density-plasma chemical vapor deposition (HDP-CVD), sub-atmospheric CVD (SACVD), or by spin-on. In some alternative embodiments, the dielectric layer 110 is a flowable dielectric layer formed by chemical vapor deposition (CVD) process and curing process.

Figure 2D:
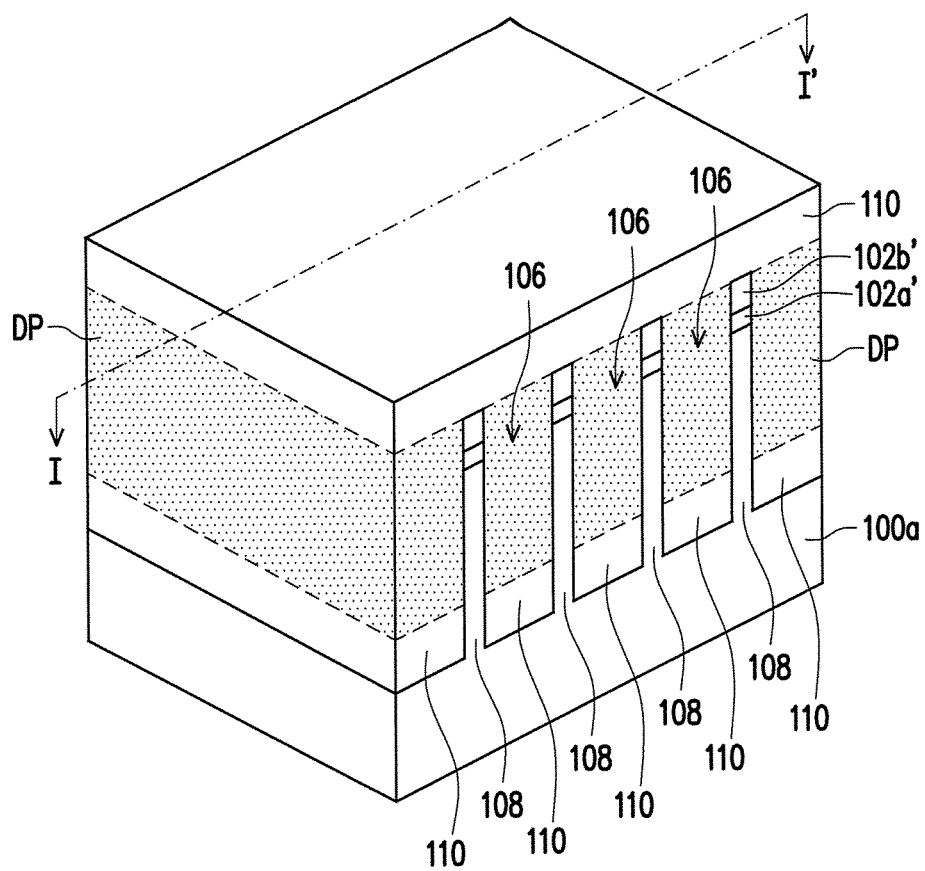
Figure 3D:
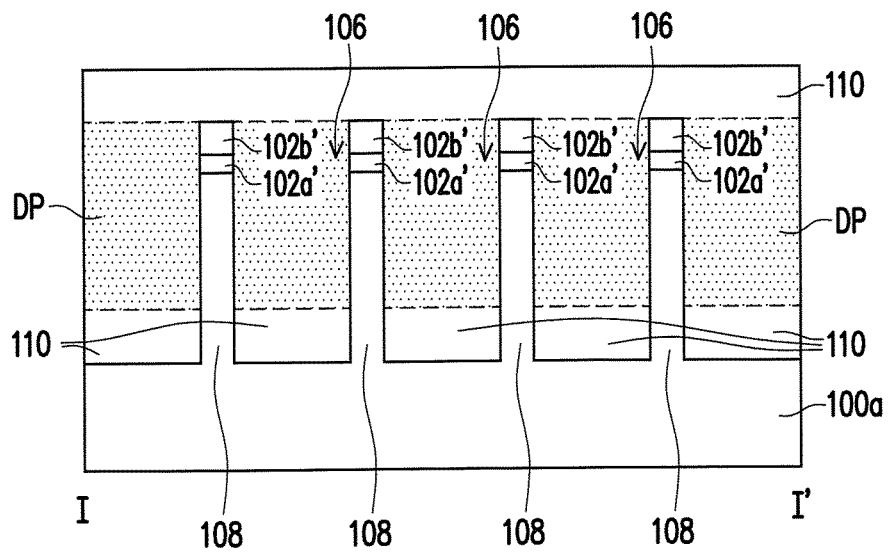

FIG. 2D is a perspective view of the FinFET at one of various stages of the manufacturing method and FIG. 3D is a cross-sectional view of the FinFET taken along the cross-sectional line I-I' of FIG. 2D. In Step S30 in FIG. 1 and as shown in FIG. 2C to FIG. 2D and FIG. 3C to FIG. 3D, a plurality of doped regions DP locally distributed in the trenches 106 are formed in the dielectric layer 110. The doped regions DP are in contact with the semiconductor fins 108 adjacent thereto, for example. The doped regions DP are not in contact with the bottom surfaces of the trenches 106. As shown in FIG. 2D and FIG. 3D, the doped regions DP are buried doped regions formed by at least one implantation process, for example. In some embodiments, implantation dopant, such as boron (B), carbon (C), nitride (N), phosphorus (P), Germanium (Ge) or a combination thereof, is implanted into the dielectric layer 110 and an annealing process is performed to form the doped regions DP in the dielectric layer 110. Through proper controls of the annealing process, the implantation depth, and the implantation dosage of the implantation dopant, the doped regions DP can be intentionally formed in the dielectric layer 110. After the doped regions DP are formed in the trenches 106, the dielectric layer 110 remains electrically insulated.

As shown in FIG. 2D and FIG. 3D, in some embodiments, the patterned pad layer 102a' and the patterned hard mask layer 102b' may protect the semiconductor fins 108 from being doped by implanted dopant. In other words, during the above-mentioned implantation process, the implanted dopant may be blocked by the patterned pad layer 102a' and/or the patterned hard mask layer 102b'. In some alternative embodiments, since the implantation process is followed by the annealing process and the implanted dopant is driven to diffuse into the semiconductor fins 108 from the doped regions DP by the annealing process, thus unintentional doped regions (not shown) resulted from the annealing process may formed in the semiconductor fins 108. In yet alternative embodiments, during the implantation process, dopant is implanted into the dielectric layer 110 and the semiconductor fins 108, and accordingly, the doped regions DP distributed in the dielectric layer 110 and doped regions (not shown) distributed in the semiconductor fins 108 are intentionally formed after the implantation process and annealing process are performed.

In some embodiments, the top surfaces of the doped regions DP are between a top surface of the dielectric layer 110 and the top surfaces of the semiconductor fins 108. In other words, the top surfaces of the doped regions DP are lower than the top surface of the dielectric layer 110 and are higher than the top surfaces of the semiconductor fins 108. For example, the top surfaces of the doped regions DP are substantially aligned with a top surface of the patterned hard mask layer 102b' and the bottom surfaces of the doped regions DP are higher than the bottom surfaces of the trenches 106, as shown in FIG. 2D and FIG. 3D.

The distribution of the doped regions DP shown in FIG. 2D and FIG. 3D is merely for illustration, the distribution of the doped regions DP may be properly modified in accordance with the actual design requirements. The modifications of the doped regions DP are the illustrated in accompany with FIG. 6 through FIG. 9.

Figure 6:
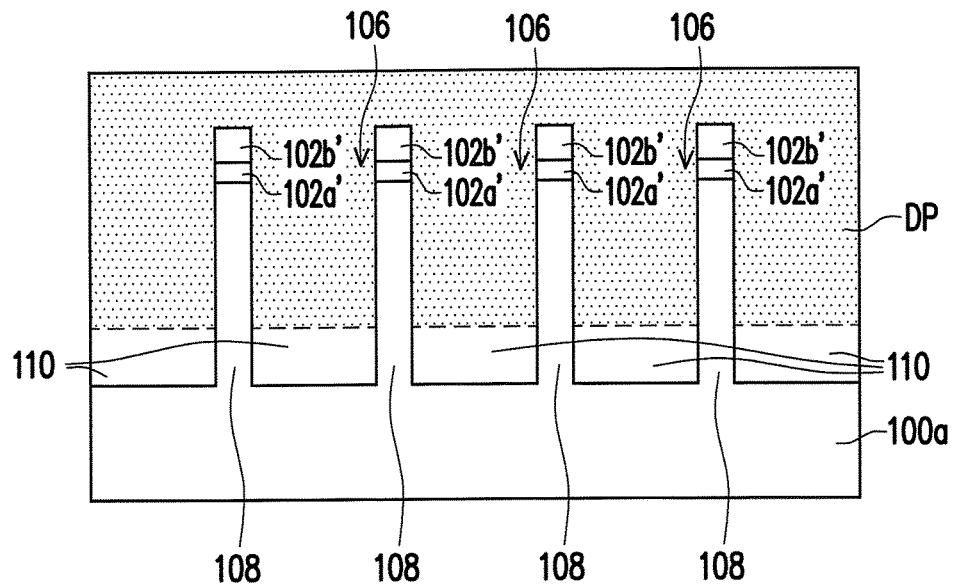
FIG. 6 through FIG. 9 illustrate various modifications of the doped regions in accordance with some alternative embodiments of the present disclosure.
Figure 7:
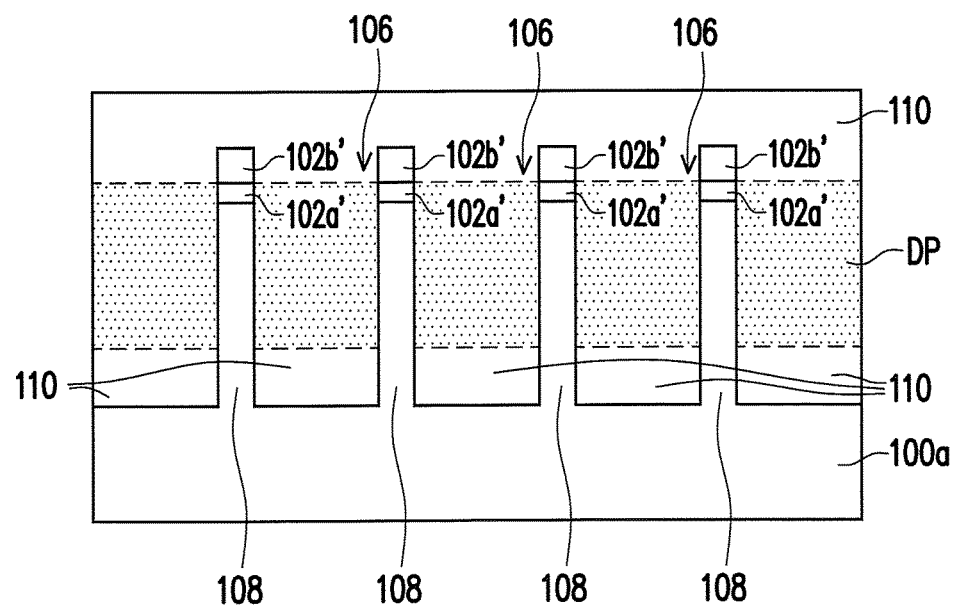
Figure 8:
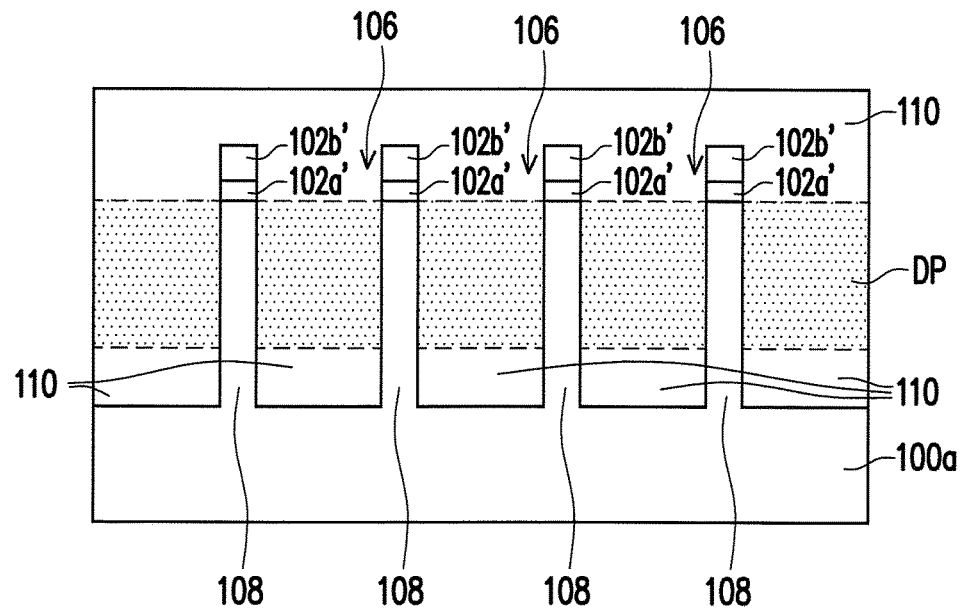

In alternative embodiments, the top surfaces of the doped regions DP are higher than the top surface of the patterned hard mask layer 102b'. For example, the top surfaces of the doped regions DP are substantially aligned with the top surface of the dielectric layer 110, as shown in FIG. 6. In yet alternative embodiments, the top surfaces of the doped regions DP are lower than the top surface of the patterned hard mask layer 102b' and higher than the top surfaces of the semiconductor fins 108. For example, the top surfaces of the doped regions DP are substantially aligned with the top surface of the patterned pad layer 102a' (as shown in FIG. 7) or the top surfaces of the semiconductor fins 108 (as shown in FIG. 8).

Figure 9:
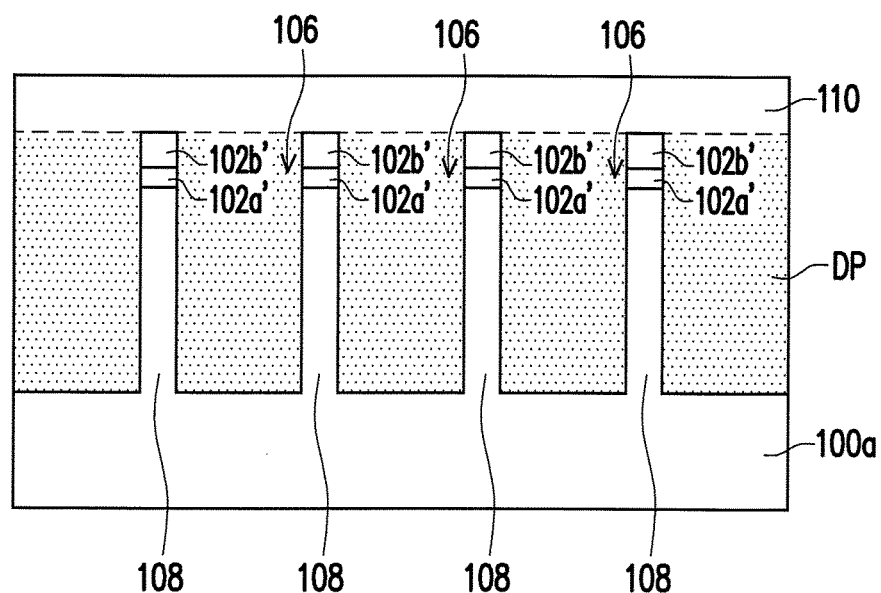

In some alternative embodiments, the bottom surfaces of the doped regions DP are substantially aligned with the bottom surfaces of the trenches 106. In other words, the doped regions DP of the dielectric layer 110 are in contact with the bottom surfaces of the trenches 106, as shown in FIG. 9.

Figure 2E:
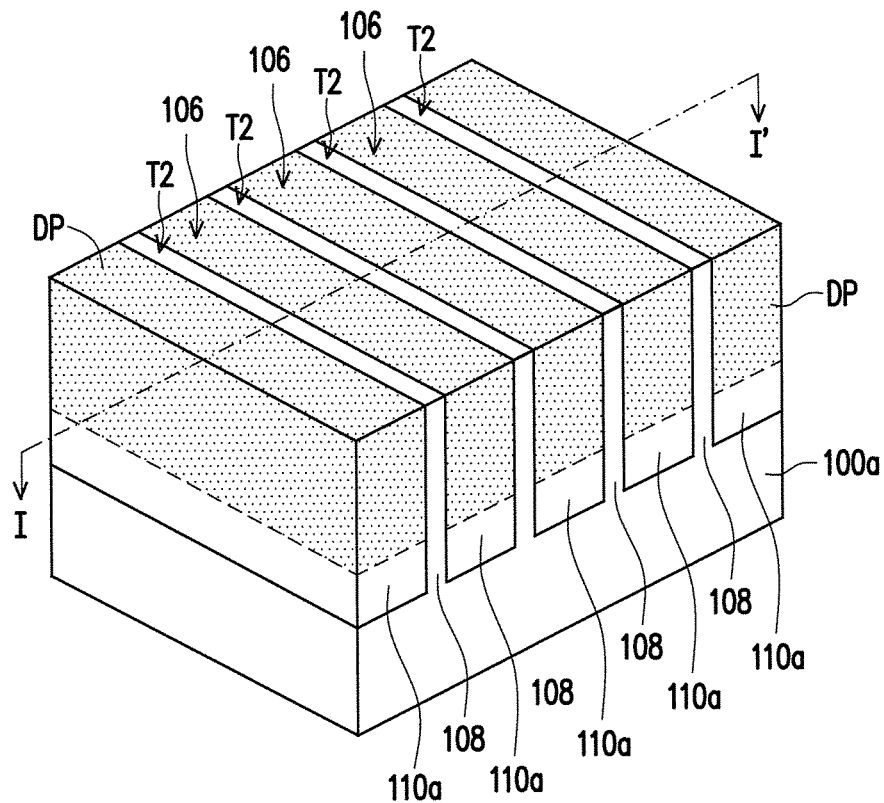
Figure 3E:
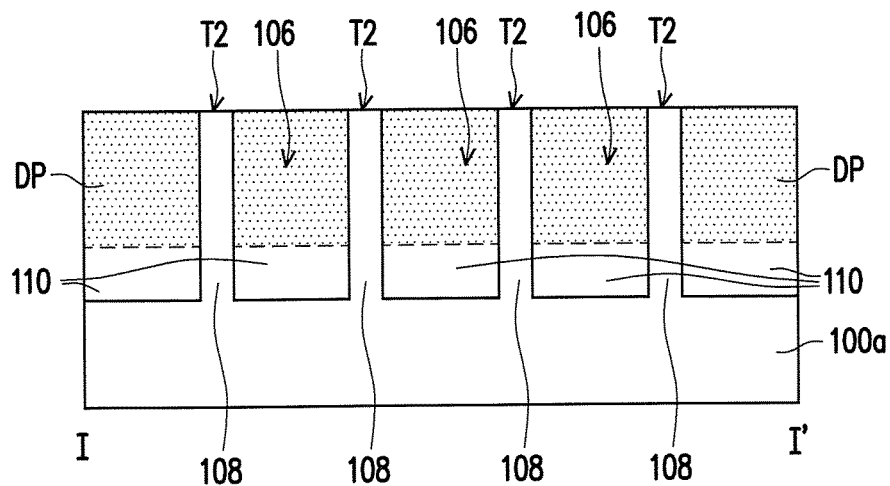

FIG. 2E is a perspective view of the FinFET at one of various stages of the manufacturing method and FIG. 3E is a cross-sectional view of the FinFET taken along the cross-sectional line I-I' of FIG. 2E. In Step S40 in FIG. 1 and as shown in FIG. 2D to FIG. 2E and FIG. 3D to FIG. 3E, a planarization process, such as chemical mechanical polish (CMP) process is, for example, performed to remove a portion of the dielectric layer 110 that is outside the trenches 106, the patterned hard mask layer 102b' and the patterned protective layer 102a' until the top surfaces T2 of the semiconductor fins 108 are exposed. As shown in FIG. 2E and FIG. 3E, after the dielectric layer 110 is polished, the top surfaces of the polished dielectric layer 110 is substantially aligned or coplanar with the top surfaces T2 of the semiconductor fins 108. Furthermore, after the dielectric layer 110 is polished, the top surfaces of the doped regions DP are substantially aligned or coplanar with the top surfaces T2 of the semiconductor fins 108.

As illustrated in FIG. 2C to FIG. 2E and FIG. 3C to FIG. 3E, the formation of the doped regions DP (i.e. step S30) is performed before the dielectric layer 110 outside the trenches 106 (i.e. step S40) is removed. However, the sequence of the above-mentioned step S30 and step S40 is not limited. In alternative embodiments, the formation of the doped regions DP (i.e. step S30) is performed after the removal of the dielectric layer 110 outside the trenches 106 (i.e. step S40). In yet alternative embodiments, some of the doped regions DP may be formed in the dielectric layer 110 before the removal of the dielectric layer 110 (i.e. step S40), while the rest of the doped regions DP may be formed in the dielectric layer 110 after the removal of the dielectric layer 110 (i.e. step S40).

Figure 2F:
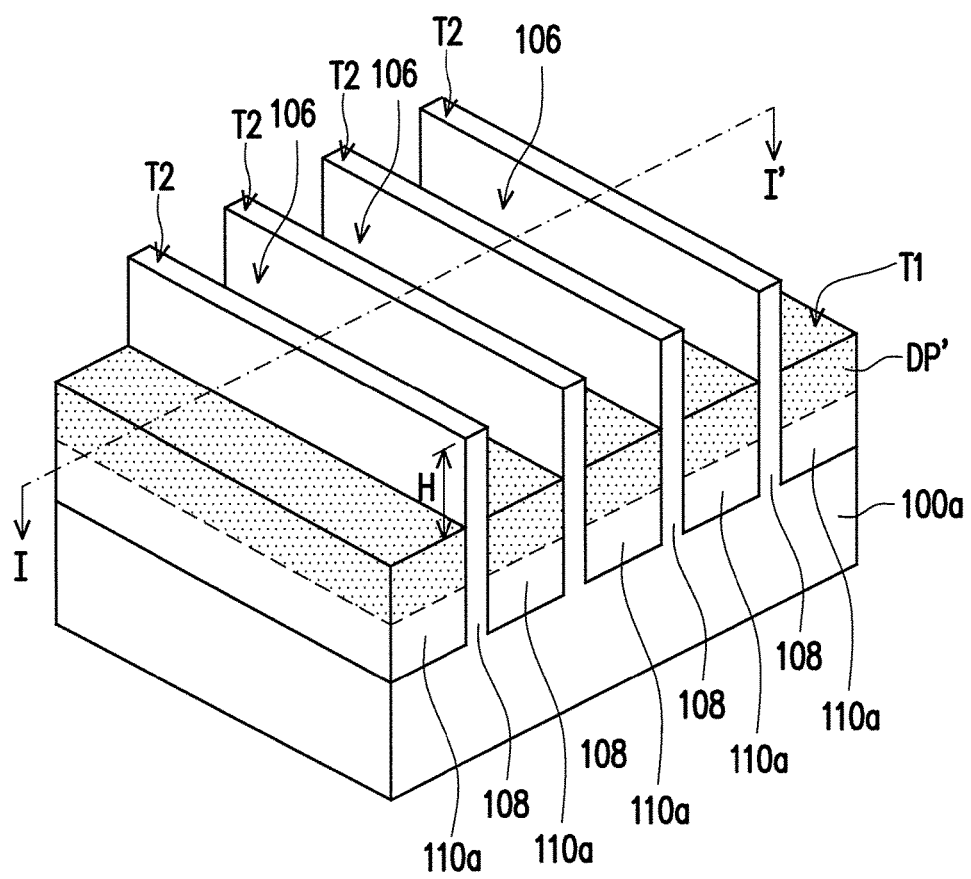
Figure 3F:
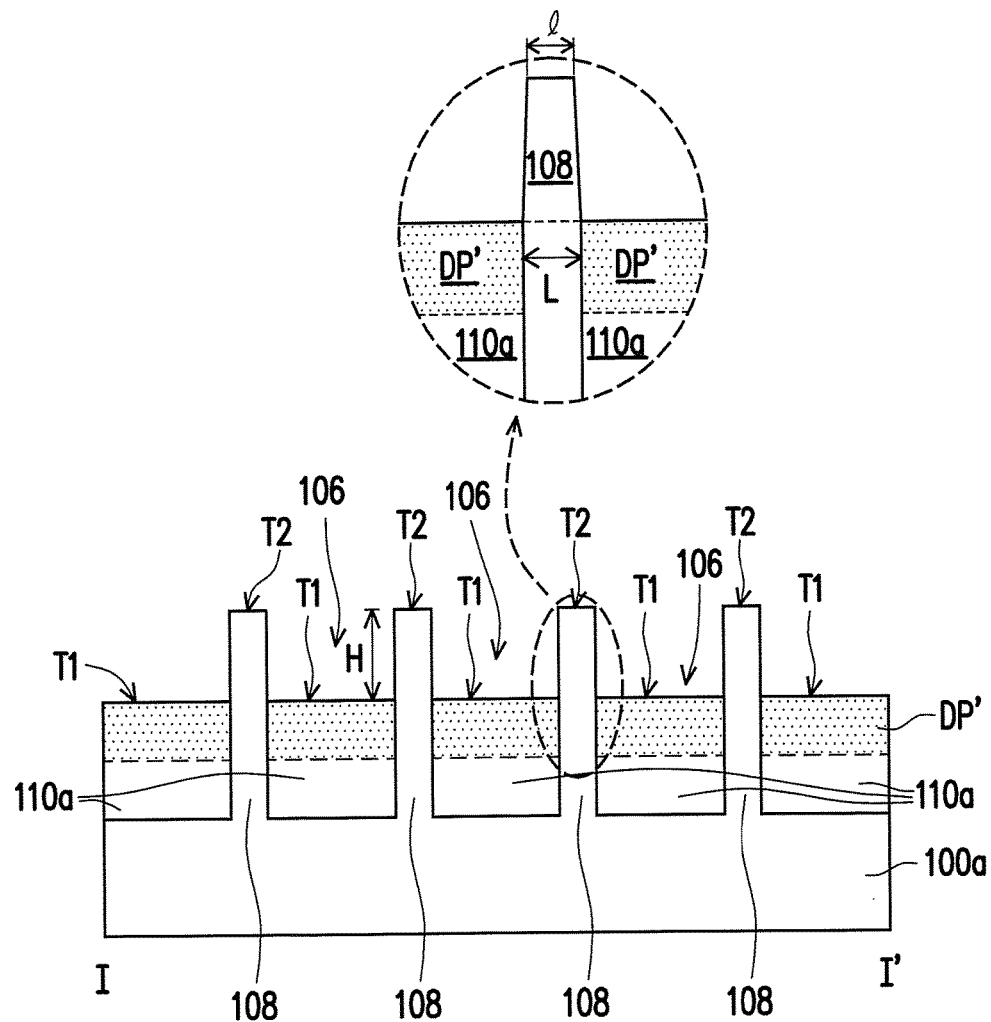

FIG. 2F is a perspective view of the FinFET at one of various stages of the manufacturing method and FIG. 3F is a cross-sectional view of the FinFET taken along the cross-sectional line I-I' of FIG. 2F. In Step S50 in FIG. 1 and as shown in FIG. 2E to FIG. 2F and FIG. 3E to FIG. 3F, after the dielectric layer 110 outside the trenches 106 is removed, the doped regions DP distributed in the trenches 106 are partially removed by an etching process such that insulators 110a (e.g. STI structure) having doped regions DP' are formed in the trenches 106. In some embodiment, the etching process may be a wet etching process with hydrofluoric acid (HF) or a dry etching process.

During the above-mentioned etching process, the etch rate of the doped regions DP of the insulators 110a is greater than the etch rate of the semiconductor fins 108. In some embodiments, the etch selectivity of the doped regions DP to the semiconductor fins 108 is greater than 60. By the implanted dopant, the characteristics of the dielectric layer 110 (shown in FIG. 2E) or the insulators 110a (shown in FIG. 2F) are modified such that the doped regions DP can be etched more rapidly. In other words, the etch rate of the doped regions DP' of the insulators 110a is greater than the etch rate of the rest portion of the insulators 110a. Accordingly, the consumption or damage issue of the semiconductor fins 108 can be minimized by the doped regions DP in the dielectric layer 110 (shown in FIG. 2E) or the doped regions DP' in the insulators 110a (shown in FIG. 2F).

As shown in 3F, after the insulators 110a are formed, the semiconductor fins 108 may have a top dimension (l) and a bottom dimension (L), wherein the top dimension (l) is greater than half of the bottom dimension (L) and less than the bottom dimension (L). In other words, the sidewalls of the semiconductor fins 108 revealed outside the insulators 110a are tapered sidewalls. Accordingly, the consumption or damage issue of the semiconductor fins 108 can be minimized.

As shown in FIG. 2F and FIG. 3F, the top surfaces T1 of the insulators 110a are lower than the top surfaces T2 of the semiconductor fins 108. The semiconductor fins 108 protrude from the top surfaces T1 of the insulators 110a. The height difference H (i.e. fin height) between the top surfaces T2 of the fins 108 and the top surfaces T1 of the insulators 110a ranges from about 15 nm to about 50 nm, for example.

Figure 2G:
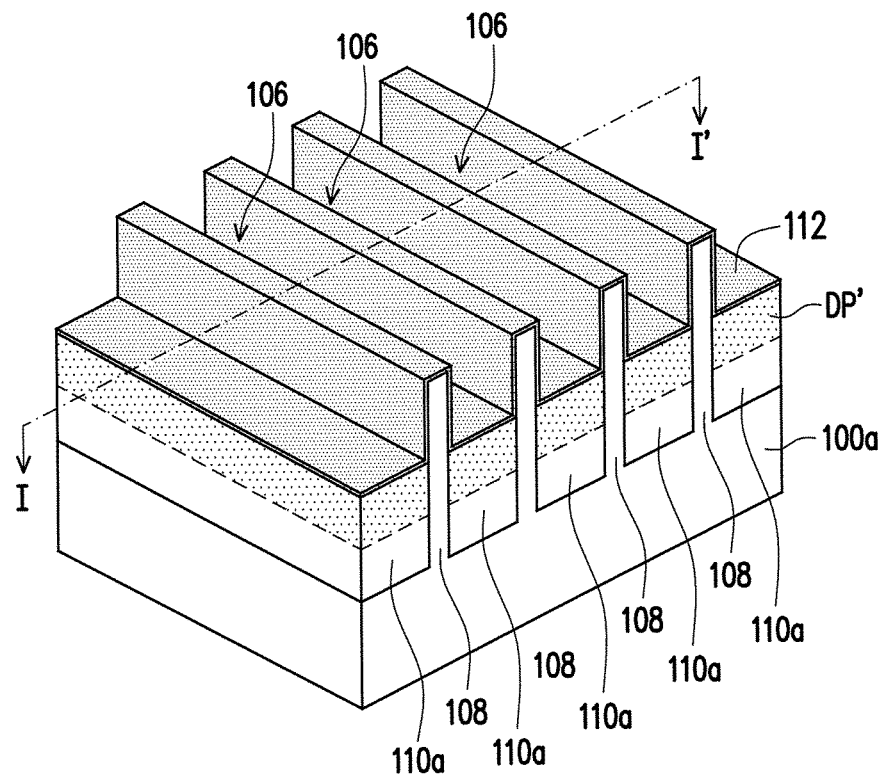
Figure 3G:
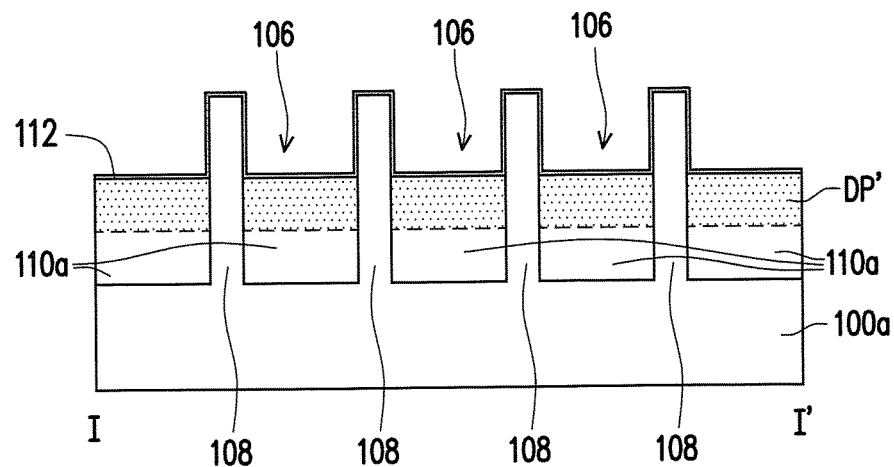

FIG. 2G is a perspective view of the FinFET at one of various stages of the manufacturing method and FIG. 3G is a cross-sectional view of the FinFET taken along the cross-sectional line I-I' of FIG. 2G. In Step S60 in FIG. 1 and as shown in FIG. 2F to FIG. 2G and FIG. 3F to FIG. 3G, a gate stack GS (shown in FIG. 2K) is formed so as to partially cover the semiconductor fins 108 and the insulators 110a. The formation of the gate stack GS (shown in FIG. 2K) is discussed in accompany with FIG. 2G through FIG. 2K and FIG. 3G through FIG. 3K.

As shown in FIG. 2G and FIG. 3G, a gate dielectric layer 112 is formed to conformally cover the insulators 110a and the semiconductor fins 108. The top surfaces of the doped regions DP' are covered by the gate dielectric layer 112. In some embodiments, the thickness of the gate dielectric layer 112 is in the range of about 20 nm to 45 nm. The gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 112 may be formed by a suitable process such as atomic layer deposition (ALD), chemical vapor deposition (CVD), physical vapor deposition (PVD), thermal oxidation, UV-ozone oxidation, or the like.

Figure 2H:
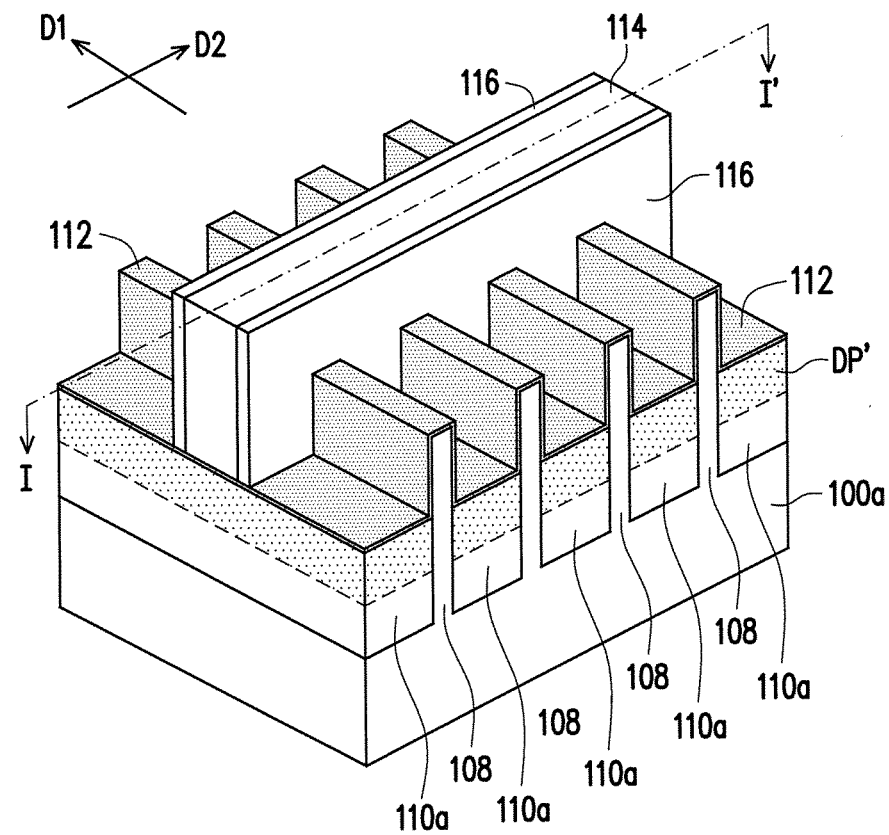
Figure 3H:
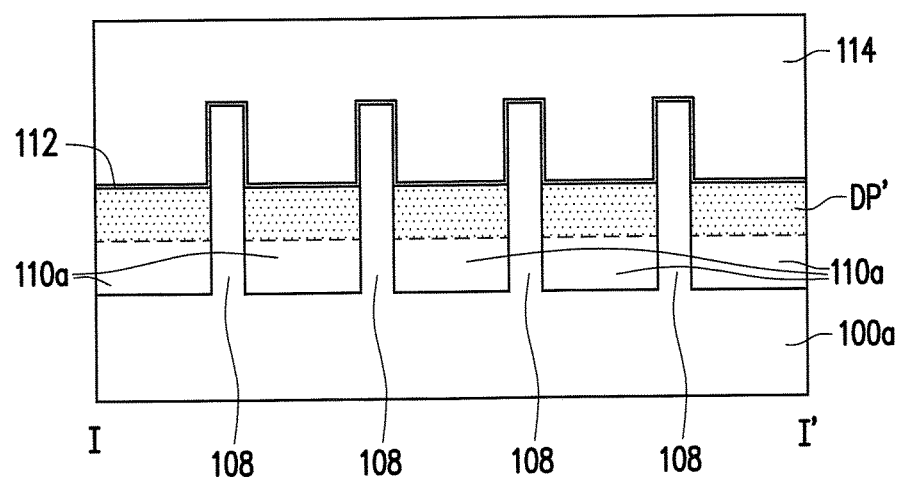

FIG. 2H is a perspective view of the FinFET at one of various stages of the manufacturing method, and FIG. 3H is a cross-sectional view of the FinFET taken along the cross-sectional line I-I' of FIG. 2H. In Step S60 in FIG. 1 and as shown in FIG. 2G to FIG. 2H and FIG. 3G to FIG. 3H, at least one dummy gate strip 114 is formed on the gate dielectric layer 112, wherein a lengthwise direction D1 of the dummy gate strip 114 is different from the lengthwise direction D2 of the semiconductor fins 108. In some embodiments, the lengthwise direction D1 of the dummy gate strip 114 is perpendicular to the lengthwise direction D2 of the semiconductor fins 108. The number of the dummy gate strip 114 shown in FIG. 2H is merely for illustration, in some alternative embodiments, two or more parallel dummy gate strips may be formed in accordance with the actual design requirements. The dummy gate strip 114 includes silicon-containing material, such as poly-silicon, amorphous silicon or a combination thereof.

As shown in FIG. 2H, after the dummy gate strip 114 is formed, a pair of spacers 116 is formed on the sidewalls of the dummy gate strip 114. The pair of spacers 116 is formed on the gate dielectric layer 112 and extends along the sidewalls of the dummy gate strip 114. In other words, the pair of spacers 116 extends along the lengthwise direction D1. The pair of spacers 116 is formed of dielectric materials, such as silicon nitride or SiCON. The pair of spacers 116 may include a single layer or multilayer structure.

Figure 2I:
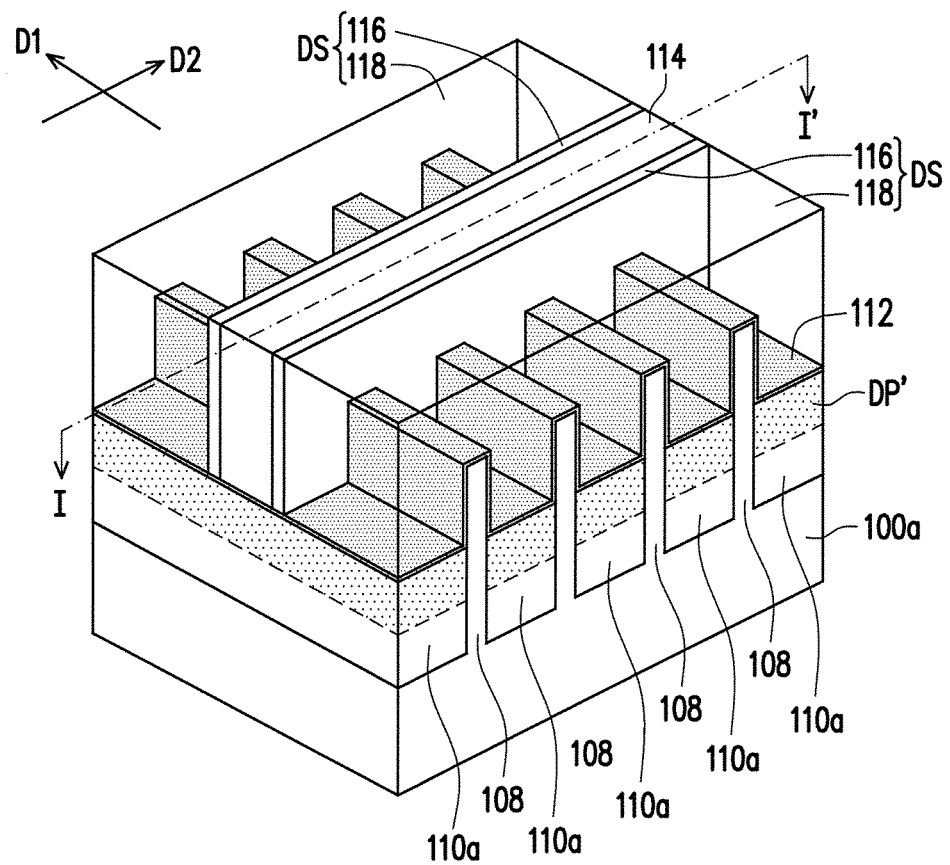
Figure 3I:
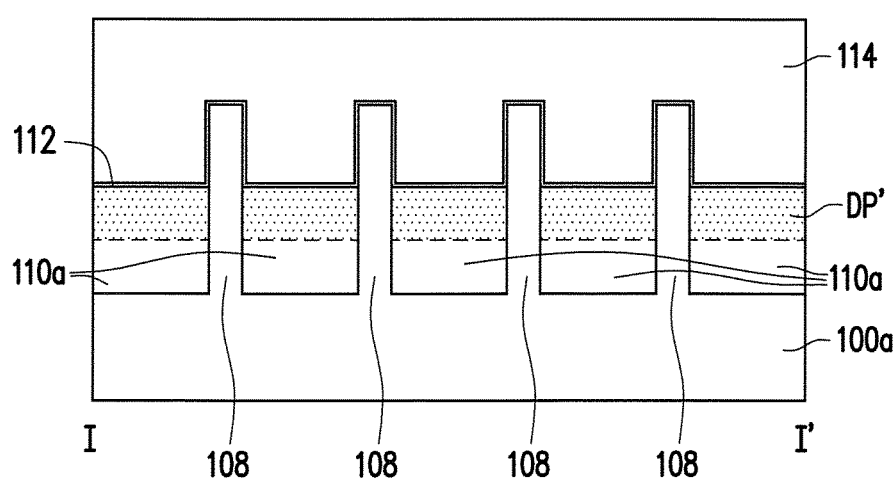

FIG. 2I is a perspective view of the FinFET at one of various stages of the manufacturing method, and FIG. 3I is a cross-sectional view of the FinFET taken along the cross-sectional line I-I' of FIG. 2I. In Step S60 in FIG. 1 and as shown in FIG. 2H to FIG. 2I and FIG. 3H to FIG. 3I, a patterned dielectric layer 118 is formed to cover the gate dielectric layer 112 that are not covered by the dummy gate strip 114 and the spacers 116. A top surface of the patterned dielectric layer 118 is substantially coplanar with the top surface of the dummy gate strip 114, for example. In some embodiments, before the patterned dielectric layer 118 is formed, some processes (e.g., patterning process of gate dielectric layer 112, semiconductor fin recessing process, strained source/drain epitaxial process on the semiconductor fin, silicidation process and so on) may be performed in advance. Details of the aforesaid optional processes are omitted.

As shown in FIG. 2I, the combination of the pair of spacers 116 and the patterned dielectric layer 118 may be considered as a dielectric structure DS adjacent to the dummy gate strip 114. In other words, the dummy gate strip 114 may be embedded in the dielectric structure DS and the dielectric structure DS partially covers the semiconductor fins 108 and the insulators 110a.

Figure 2J:
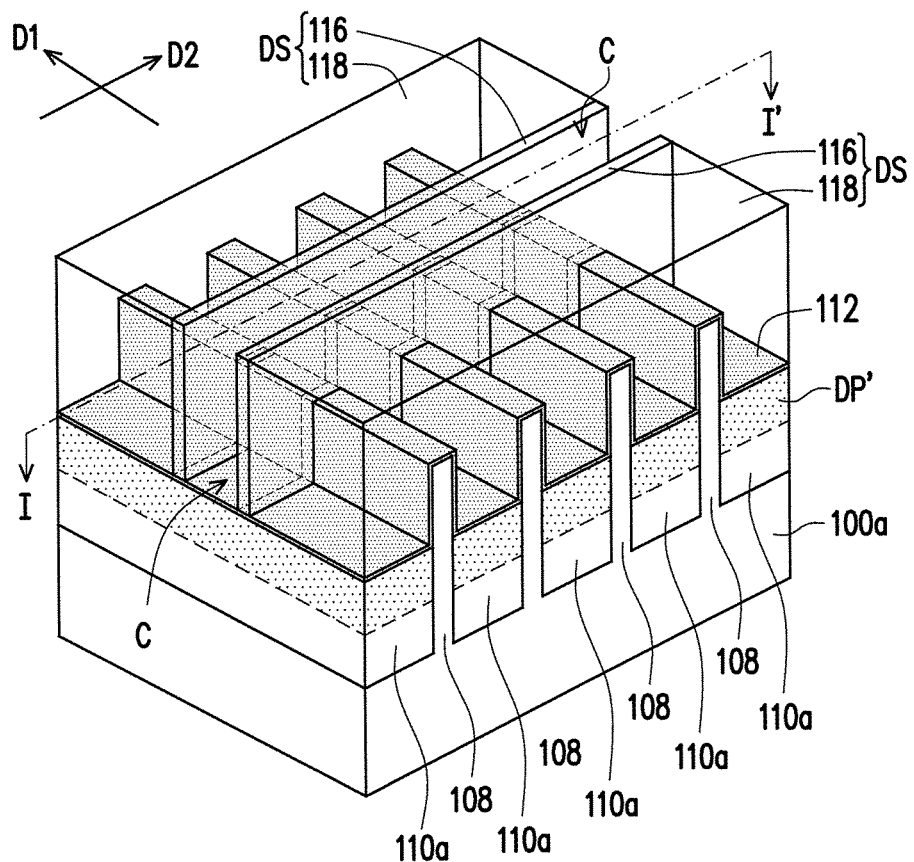
Figure 3J:
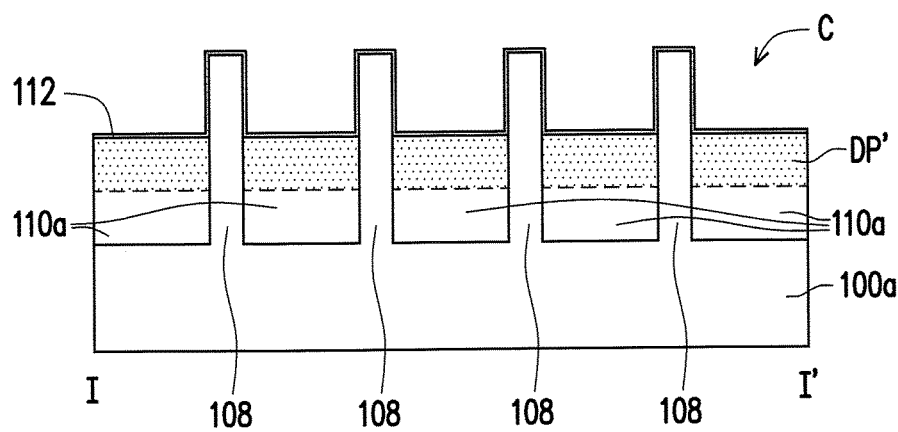

FIG. 2J is a perspective view of the FinFET at one of various stages of the manufacturing method, and FIG. 3J is a cross-sectional view of the FinFET taken along the cross-sectional line I-I' of FIG. 2J. In Step S60 in FIG. 1 and as shown in FIG. 2I to FIG. 2J and FIG. 3I to FIG. 3J, the dummy gate strip 114 is removed. In some embodiments, the dummy gate strip 114 is removed, for example, by an etching process. Through properly selecting the etchant, the dummy gate strip 114 is removed without damaging the patterned dielectric layers 118, the gate dielectric layer 112, and the spacers 116 significantly. After the dummy gate strip 114 is removed, a cavity C between the pair of spacers 116 is formed. In other words, the dielectric gate layer 112 is partially exposed by the cavity C.

Figure 2K:
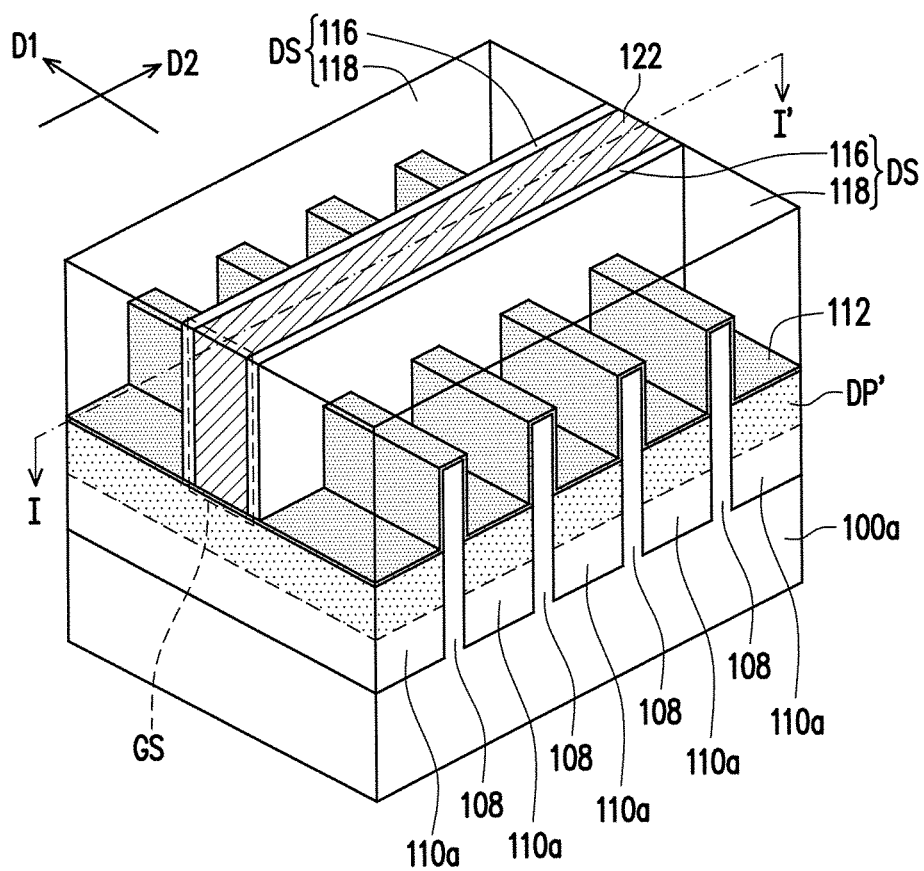
Figure 3K:
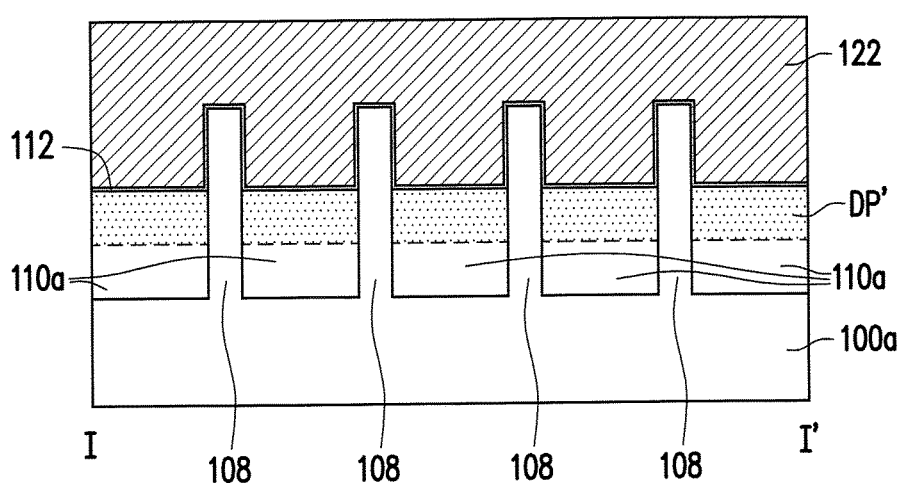

FIG. 2K is a perspective view of the FinFET at one of various stages of the manufacturing method, and FIG. 3K is a cross-sectional view of the FinFET taken along the cross-sectional line I-I' of FIG. 2K. In Step S60 in FIG. 1 and as shown in FIG. 2J to FIG. 2K and FIG. 3J to FIG. 3K, after the cavity C is formed, a gate 122 is formed in and fills the cavity C, and the gate 122 covers the gate dielectric layer 112 exposed by the cavity C. The width of the gate 122 is substantially identical with the width of the dummy gate strip 114 (as shown in FIG. 2I). The channel length of the FinFET is relevant to or is determined by the width of the gate 122. In other words, the portions of the semiconductor fins 108 that are overlapped with and covered by the gate 122 serve as channels of FinFETs.

As shown in FIG. 2K, in one embodiment, the gate 122 and the gate dielectric layer 112 underneath are considered as a gate stack GS, the dielectric structure DS (e.g., the pair of spacers 116 or the combination of the pair of spacers 116 and the patterned dielectric layer 118) is formed on the sidewalls of the gate stack GS, and the top surface of the dielectric structure DS is substantially coplanar with a top surface of the gate stack GS, for example. In alternative embodiments, the above-illustrated gate replacement process (FIG. 2J through FIG. 2K and FIG. 3J through FIG. 3K) may be omitted.

Figure 4A:
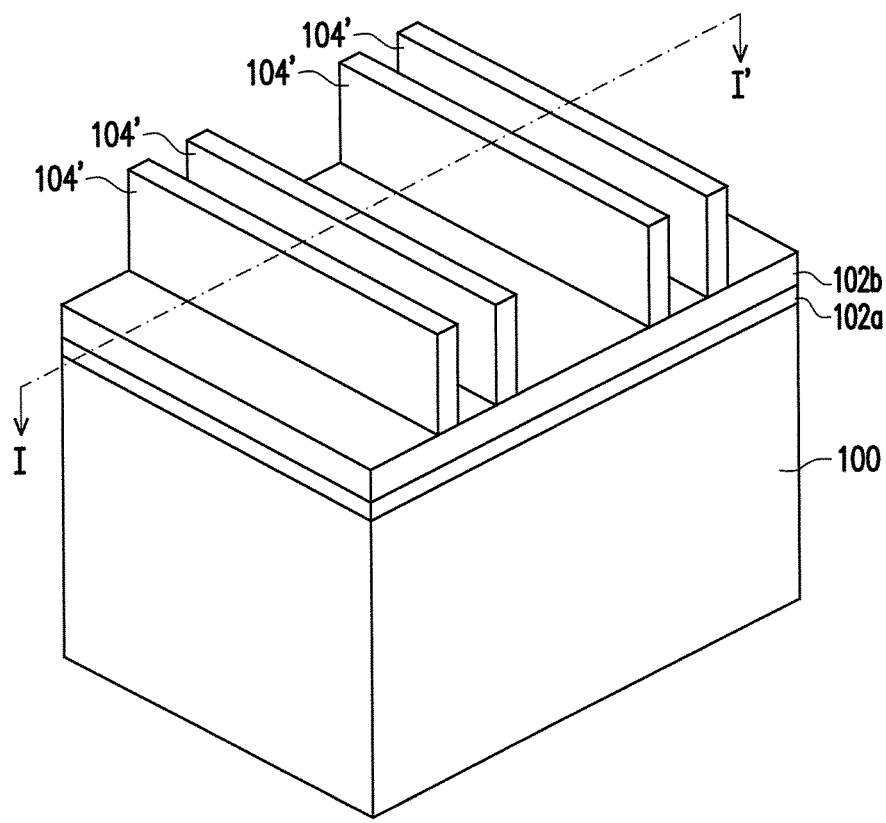
FIG. 4A through FIG. 4K are the perspective views of a method for fabricating a FinFET in accordance with some alternative embodiments of the present disclosure.
Figure 5A:
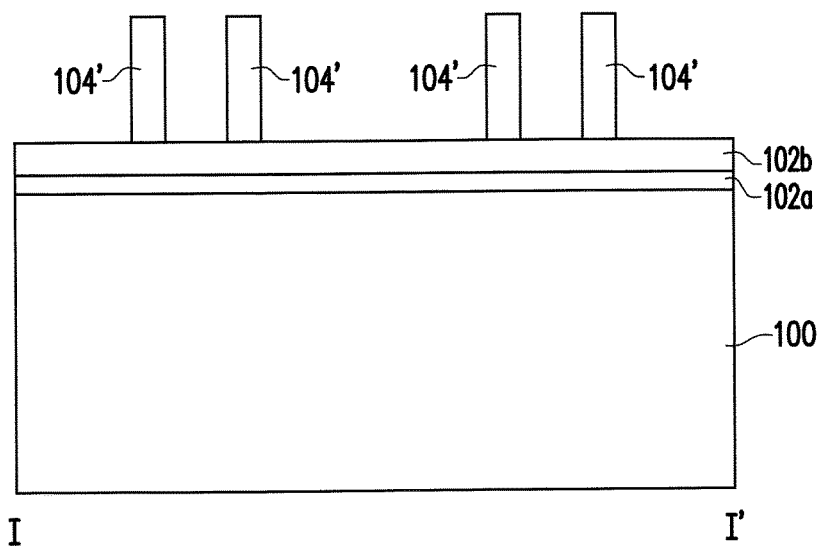
FIG. 5A through FIG. 5K are the cross-sectional views of a method for fabricating a FinFET in accordance with some alternative embodiments of the present disclosure.

FIG. 4A is a perspective view of the FinFET at one of various stages of the manufacturing method, and FIG. 5A is a cross-sectional view of the FinFET taken along the cross-sectional line I-I' of FIG. 4A. In Step S10 in FIG. 1 and as shown in FIG. 4A and FIG. 5A, a substrate 100 having a protective layer 102a and a hard mask layer 102b formed thereon is provided. Then, a patterned photoresist layer 104' having a predetermined pattern is formed on the hard mask layer 102b.

Figure 4B:
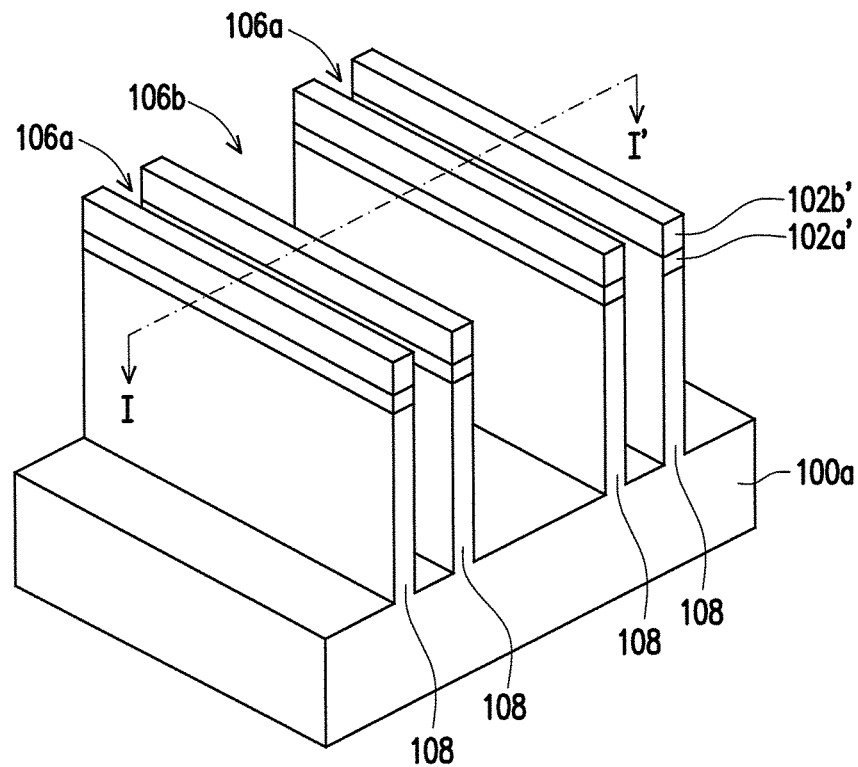
Figure 5B:
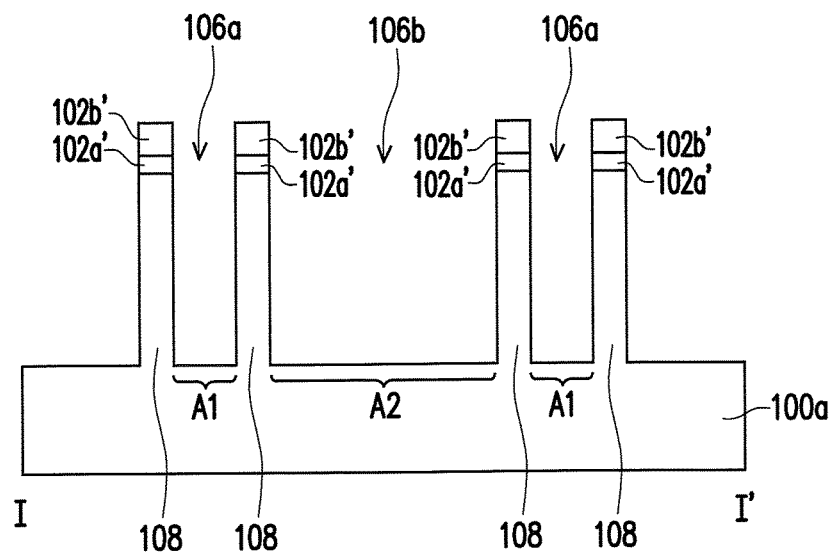

FIG. 4B is a perspective view of the FinFET at one of various stages of the manufacturing method, and FIG. 5B is a cross-sectional view of the FinFET taken along the cross-sectional line I-I' of FIG. 4B. In Step S10 in FIG. 1 and as shown in FIG. 4A to FIG. 4B and FIG. 5A to FIG. 5B, the hard mask layer 102b and the protective layer 102a which are not covered by the patterned photoresist layer 104' are etched to form a patterned hard mask layer 102b' and a patterned protective layer 102a' so as to expose underlying substrate 100. By using the patterned hard mask layer 102b', the patterned protective layer 102a', and the patterned photoresist layer 104' as a mask, portions of the substrate 100 are exposed and etched to form at least one of the first trenches 106a, at least one of the second trenches 106b, and semiconductor fins 108. The semiconductor fins 108 are spaced apart by the first and second trenches (106a and 106b), wherein an area A2 occupied by the second trench 106b is greater than an area A1 occupied by the first trench 106a. The number of the first trench 106a, the second trench 106b, and the semiconductor fins 108 is merely for illustration.

In some embodiments, the width W of the first trench 106a ranges from about 22 nm to about 32 nm while the width W of the second trench 106b ranges from about 32 nm to about 320 nm. The height of the semiconductor fins 108 and the depth D of the trenches 106 range from about 40 nm to about 70 nm, for example. After the first trench 106a, the second trench 106b, and the semiconductor fins 108 are formed, the patterned photoresist layer 104' is then removed. In one embodiment, a cleaning process may be performed to remove a native oxide of the semiconductor substrate 100a and the semiconductor fins 108. The cleaning process may be performed using diluted hydrofluoric (DHF) acid or other suitable cleaning solutions.

Figure 4C:
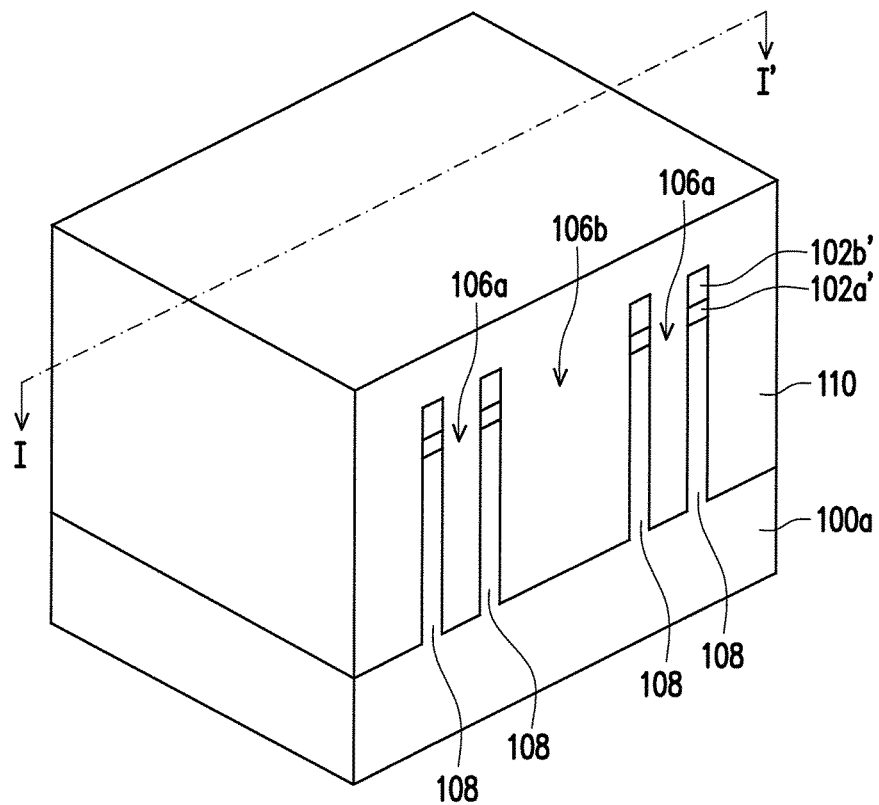
Figure 5C:
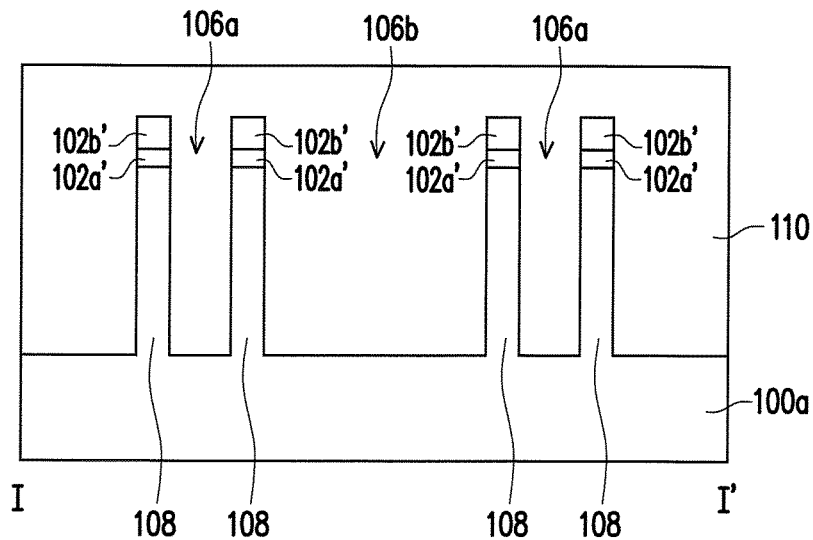

FIG. 4C is a perspective view of the FinFET at one of various stages of the manufacturing method, and FIG. 5C is a cross-sectional view of the FinFET taken along the cross-sectional line I-I' of FIG. 4C. In Step S20 in FIG. 1 and as shown in FIG. 4B to FIG. 4C and FIG. 5B to FIG. 5C, after the first trench 106a, the second trench 106b, and the semiconductor fins 108 are formed, a dielectric layer 110 is then formed over the substrate 100a to fill up the first and second trenches (106a and 106b), and covers the semiconductor fins 108. In addition to the semiconductor fins 108, the dielectric layer 110 further covers the patterned pad layer 102a' and the patterned hard mask layer 102b'.

Figure 4D:
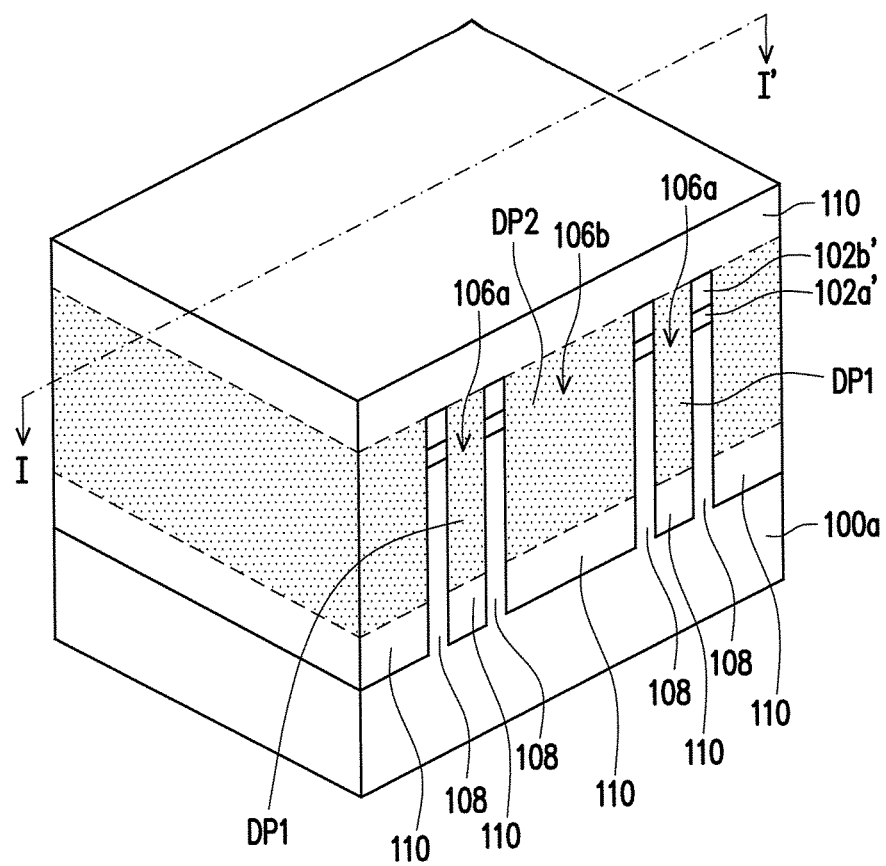
Figure 5D:
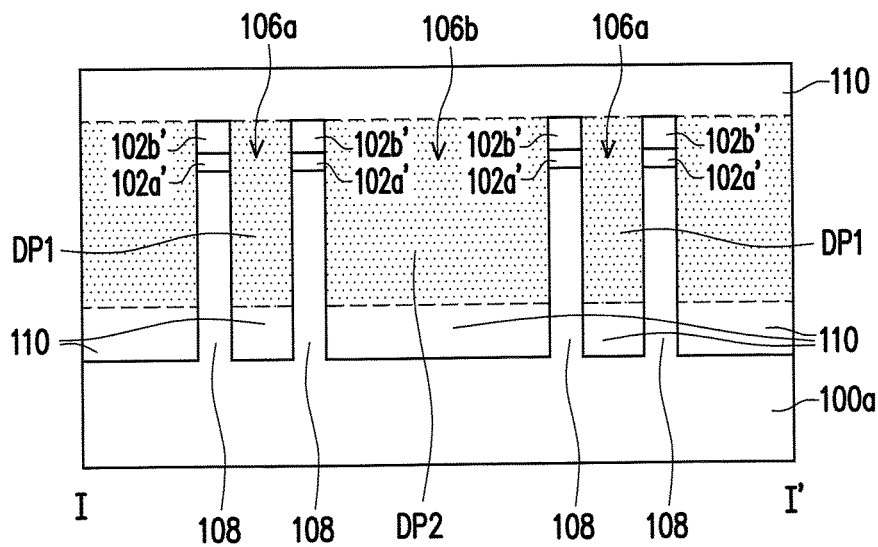

FIG. 4D is a perspective view of the FinFET at one of various stages of the manufacturing method, and FIG. 5D is a cross-sectional view of the FinFET taken along the cross-sectional line I-I' of FIG. 4D. In Step S30 in FIG. 1 and as shown in FIG. 4C to FIG. 4D and FIG. 5C to FIG. 5D, at least one first doped region DP1 locally distributed in the first trench 106a and at least one second doped region DP2 locally distributed in the second trench 106b are formed in the dielectric layer 110. The first and second doped regions (DP1 and DP2) are in contact with the semiconductor fins 108 adjacent thereto, for example. The first and second doped regions (DP1 and DP2) are not in contact with the bottom surfaces of the first and second trenches (106a and 106b). As shown in FIG. 4D and FIG. 5D, the first and second doped regions (DP1 and DP2) are buried doped regions formed by at least one implantation process, for example. In some embodiments, the implantation dopant, such as boron (B), carbon (C), nitride (N), phosphorus (P), germanium (Ge), or a combination thereof, is implanted into the dielectric layer 110, and an annealing process is performed to form the first and second doped regions (DP1 and, DP2) in the dielectric layer 110. Through proper controls of the annealing process, the implantation depth, and the implantation dosage of the implantation dopant, the first and second doped regions (DP1 and DP2) can be intentionally formed in the dielectric layer 110. After the first and second doped regions (DP1 and DP2) are formed in the first trench 106a and the second trench 106b, the dielectric layer 110 remains electrically insulated. In some embodiments, the first doped region DP1 contains a first dopant distributed therein, and the second doped region DP2 at least contains a second dopant distributed therein. The first dopant is different from the second dopant.

In some embodiments, the first and second doped regions (DP1 and DP2) may be formed by different implantation processes. For example, the first and second doped regions (DP1 and DP2) may be formed by implanting the first dopant and the second dopant into the dielectric layer 110 by different implantation processes, wherein the first dopant is distributed in the first trench 106a and the second trench 106b, and the second dopant is distributed in the second trench 106b. In other words, the first doped region DP1' contains the first dopant, and the second doped region DP2' contains the first and second dopants.

In some alternative embodiments, the first and second doped regions (DP1 and DP2) may be formed by implanting the first dopant into the dielectric layer 110 before the dielectric layer 110 outside the first and second trenches (106a and 106b) is removed by a first implantation process; and implanting the second dopant into the dielectric layer 110 after the dielectric layer 110 outside the first and second trenches (106a and 106b) is removed by a second implantation process, wherein the first dopant is distributed in the first trench 106a and the second trench 106b, and the second dopant is distributed in the second trench 106b. In other words, the first doped region DP1' contains the first dopant, and the second doped region DP2' contains the first and second dopants.

As shown in FIG. 4D and FIG. 5D, in some embodiments, the patterned pad layer 102a' and the patterned hard mask layer 102b' may protect the semiconductor fins 108 from being doped by implanted dopant. In other words, during the above-mentioned implantation process, the implanted dopant may be blocked by the patterned pad layer 102a' and/or the patterned hard mask layer 102b'. In some alternative embodiments, since the implantation process is followed by the annealing process, and the implanted dopant is driven to diffuse into the semiconductor fins 108 from the first and second doped regions (DP1 and DP2) by the annealing process, thus unintentional doped regions (not shown) resulted from the annealing process may formed in the semiconductor fins 108. In yet alternative embodiments, during the implantation process, dopant is implanted into the dielectric layer 110 and the semiconductor fins 108, and accordingly, the first and second doped regions (DP1 and DP2) distributed in the dielectric layer 110 and the doped regions (not shown) distributed in the semiconductor fins 108 are intentionally formed after the implantation process and annealing process are performed.

The distribution of the first and second doped regions (DP1 and DP2) shown in FIG. 4D and FIG. 5D is merely for illustration, the distribution of the first and second doped regions (DP1 and DP2) may be properly modified in accordance with the actual design requirements. Modifications of the first and second doped regions (DP1 and DP2) are similar with the doped regions DP and may be referred to FIG. 6 through FIG. 9.

Figure 4E:
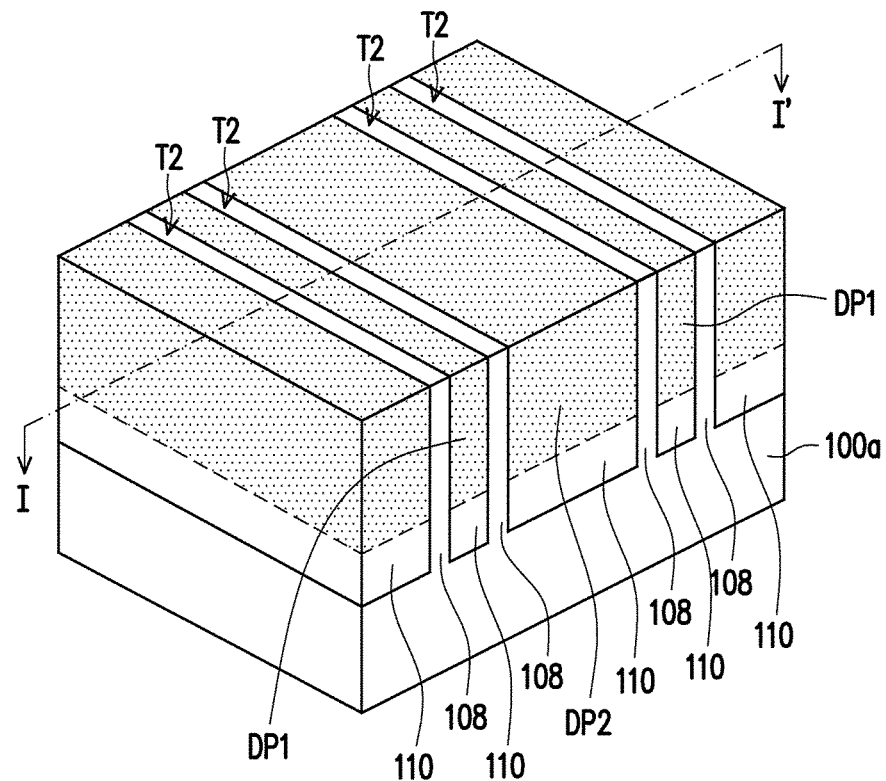
Figure 5E:
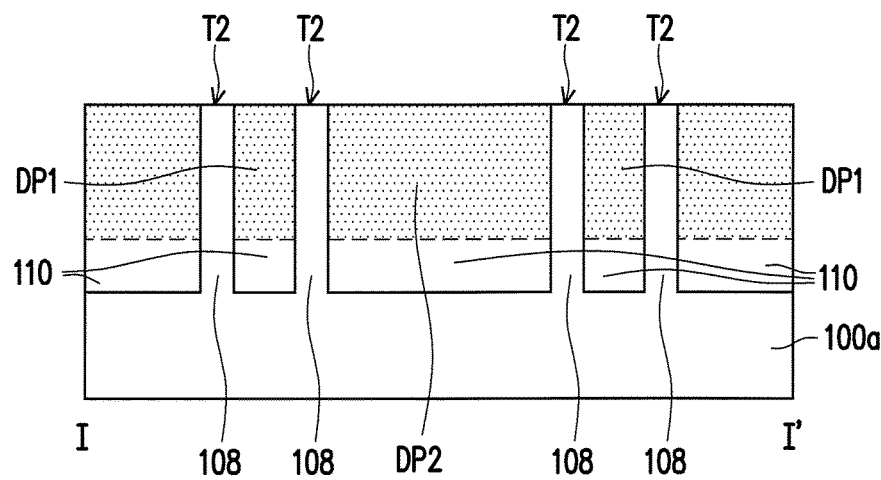

FIG. 4E is a perspective view of the FinFET at one of various stages of the manufacturing method, and FIG. 5E is a cross-sectional view of the FinFET taken along the cross-sectional line I-I' of FIG. 4E. In Step S40 in FIG. 1 and as shown in FIG. 4D to FIG. 4E and FIG. 5D to FIG. 5E, a planarization process, such as chemical mechanical polish (CMP) process is, for example, performed to remove a portion of the dielectric layer 110 that is outside the first trench 106a, the second trench 106b, the patterned hard mask layer 102b', and the patterned protective layer 102a' until the top surfaces T2 of the semiconductor fins 108 are exposed. As shown in FIG. 4E and FIG. 5E, after the dielectric layer 110 is polished, the top surfaces of the polished dielectric layer 110 is substantially aligned or coplanar with the top surfaces T2 of the semiconductor fins 108. Furthermore, after the dielectric layer 110 is polished, the top surfaces of the first and second doped regions (DP1 and DP2) are substantially aligned or coplanar with the top surfaces T2 of the semiconductor fins 108.

As illustrated in FIG. 4C to FIG. 4E and FIG. 5C to FIG. 5E, the formation of the first and second doped regions (DP1 and DP2) is performed before the dielectric layer 110 outside the first and second trenches (106a and 106b) is removed. In other words, the step S30 is performed before the step S40. However, the sequence of the above-mentioned step S30 and step S40 is not limited. In alternative embodiments, the formation of the first and second doped regions (DP1 and DP2) is performed after the removal of the dielectric layer 110 outside the first and second trenches (106a and 106b). In other words, the step S30 is performed after the step S40. In yet alternative embodiments, the first doped region DP1 may be formed in the dielectric layer 110 before the removal of the dielectric layer 110 (i.e. step S40) while the second doped region DP2 may be formed in the dielectric layer 110 after the removal of the dielectric layer 110 (i.e. step S40). In still yet alternative embodiments, the first doped region DP1 may be formed in the dielectric layer 110 after the removal of the dielectric layer 110 (i.e. step S40) while the second doped region DP2 may be formed in the dielectric layer 110 before the removal of the dielectric layer 110 (i.e. step S40).

Figure 4F:
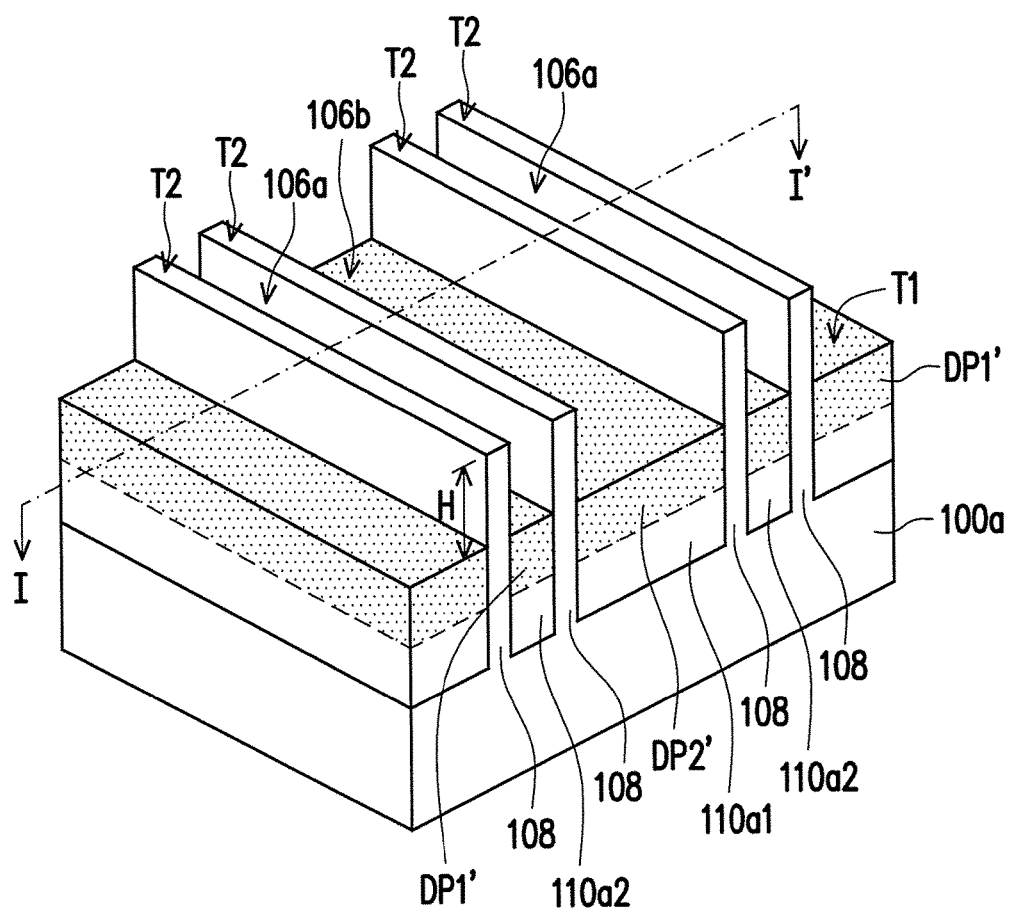
Figure 5F:
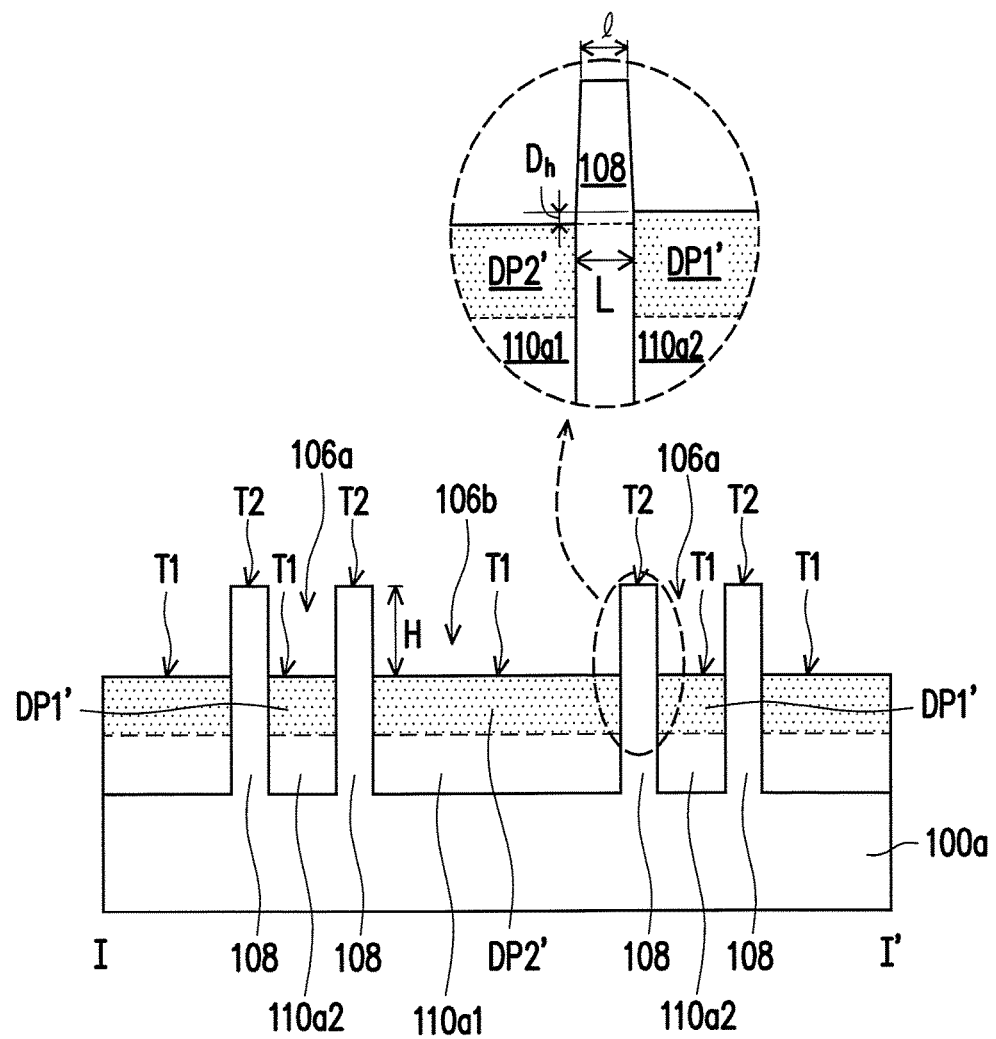

FIG. 4F is a perspective view of the FinFET at one of various stages of the manufacturing method, and FIG. 5F is a cross-sectional view of the FinFET taken along the cross-sectional line I-I' of FIG. 4F. In Step S50 in FIG. 1 and as shown in FIG. 4E to FIG. 4F and FIG. 5E to FIG. 5F, after the dielectric layer 110 outside the first and second trenches (106a and 106b) is removed, the first and second doped regions (DP1 and DP2) distributed in the first and second trenches (106a and 106b) are partially removed by an etching process such that a first insulator 110a1 having a first doped region DP1' and a second insulator 110a2 having a second doped region DP2' are respectively formed in the first and second trenches (106a and 106b). In some embodiment, the etching process may be a wet etching process with hydrofluoric acid (HF) or a dry etching process.

During the above-mentioned etching process, the etch rate of the first and second doped regions (DP1 and DP2) of the first and second insulators (110a1 and 110a2) is greater than the etch rate of the semiconductor fins 108. In some embodiments, the etch selectivity of the first and second doped regions (DP1 and DP2) to the semiconductor fins 108 is greater than 60. By modifying the implanted dopant, the characteristics of the dielectric layer 110 (shown in FIG. 2E), or the insulators 110a (shown in FIG. 2F), the first and second doped regions (DP1 and DP2) can be etched more rapidly. In other words, the etch rate of the first and second doped regions (DP1' and DP2') of the first and second insulators (110a1 and 110a2) is greater than the etch rate of the rest portion of the first and second insulators (110a1 and 110a2). Accordingly, the consumption or damage issue of the semiconductor fins 108 can be minimized by the first and second doped regions (DP1, DP2, DP1', and DP2').

As shown in 3F, after the first and second insulators (110a1 and 110a2) are formed, the semiconductor fins 108 may have a top dimension (l) and a bottom dimension (L), wherein the top dimension (l) is greater than half of the bottom dimension (L) and less than the bottom dimension (L). In other words, the sidewalls of the semiconductor fins 108 revealed outside the first and second insulators (110a1 and 110a2) are tapered sidewalls. Furthermore, the top surface T1 of the first insulator 110a1 in the dense area and the top surface T1 of the second insulator 110a2 in the isolated area may locate at different height levels and a height difference $D_h$ therebetween is less than 0.25 nm. In other words, loading effect can be improved effectively.

As shown in FIG. 4F and FIG. 5F, the top surfaces T1 of the first and second insulators (110a1 and 110a2) are lower than the top surfaces T2 of the semiconductor fins 108. The semiconductor fins 108 protrude from the top surfaces T1 of the first and second insulators (110a1 and 110a2). The height difference H (i.e. fin height) between the top surfaces T2 of the fins 108 and the top surfaces T1 of the first and second insulators (110a and 110a2) ranges from about 15 nm to about 50 nm, for example.

Figure 4G:
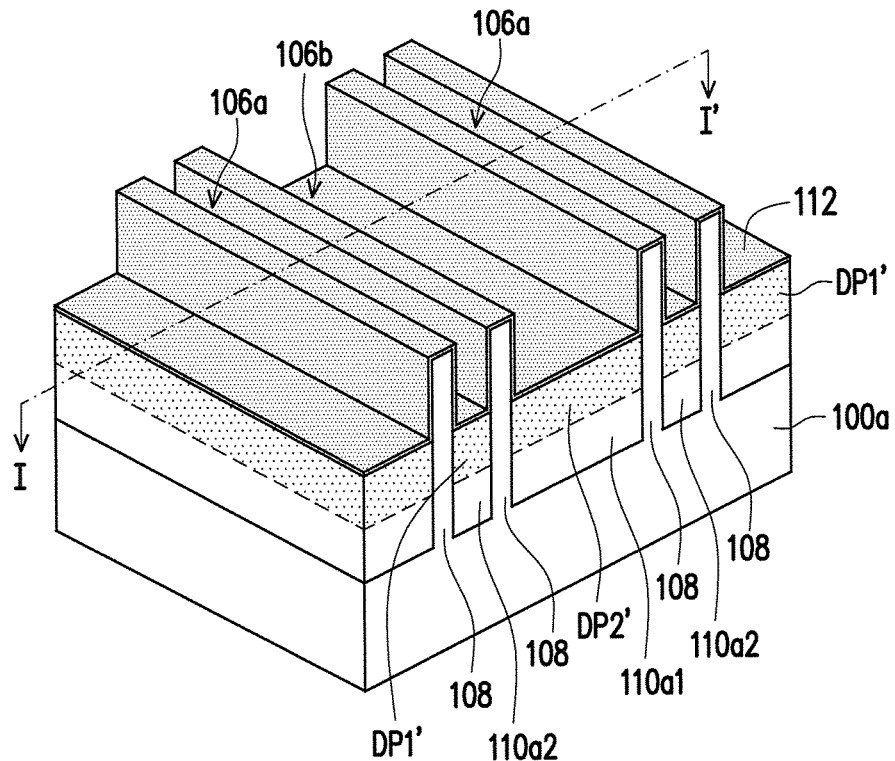
Figure 5G:
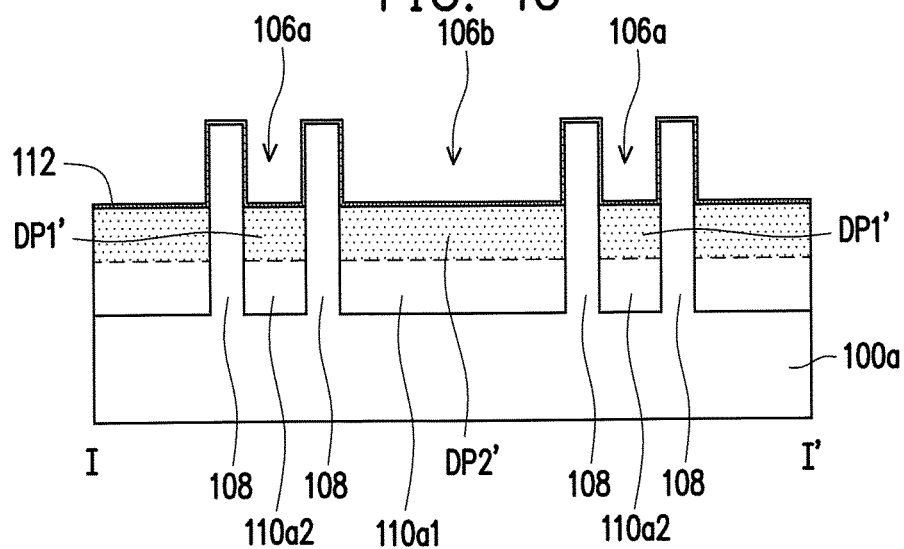

FIG. 4G is a perspective view of the FinFET at one of various stages of the manufacturing method, and FIG. 5G is a cross-sectional view of the FinFET taken along the cross-sectional line I-I' of FIG. 4G. In Step S60 in FIG. 1 and as shown in FIG. 4F to FIG. 4G and FIG. 5F to FIG. 5G, a gate stack GS (shown in FIG. 4K) is formed so as to partially cover the semiconductor fins 108 and the first and second insulators (110a1 and 110a2). The formation of the gate stack GS (shown in FIG. 4K) is discussed in accompany with FIG. 4G through FIG. 4K and FIG. 5G through FIG. 5K.

As shown in FIG. 4G and FIG. 5G, a gate dielectric layer 112 is formed to conformally cover the first and second insulators (110a1 and 110a2) and the semiconductor fins 108. The top surfaces of the first and second doped regions (DP1' and DP2') are covered by the gate dielectric layer 112. In some embodiments, the thickness of the gate dielectric layer 112 is in the range of about 20 nm to 45 nm.

Figure 4H:
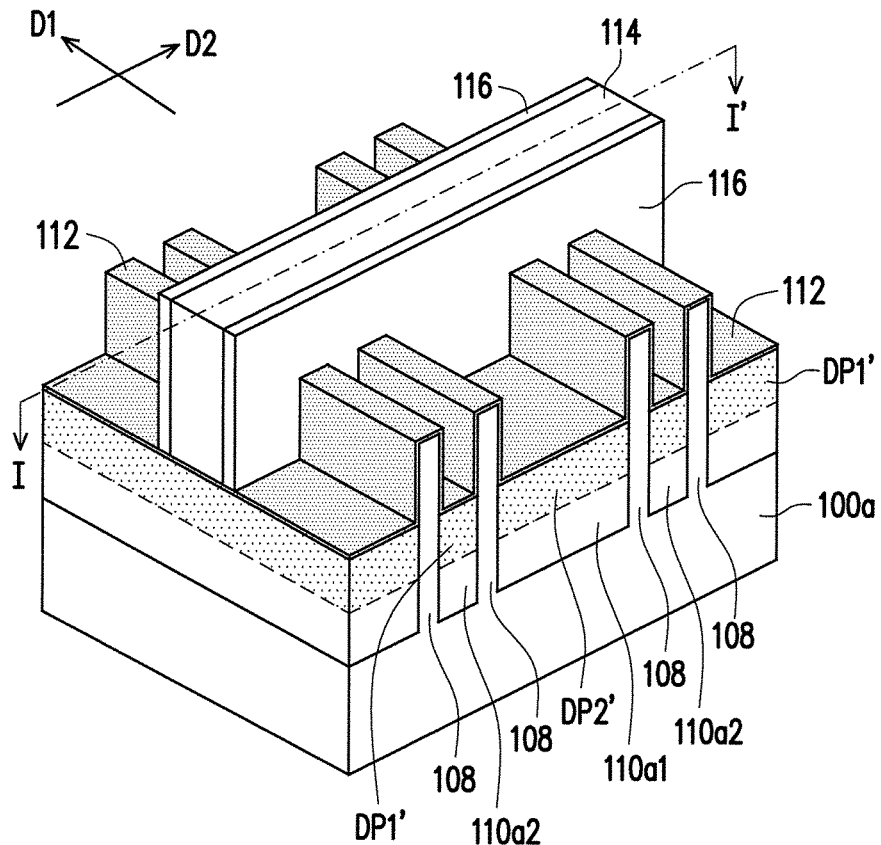
Figure 5H:
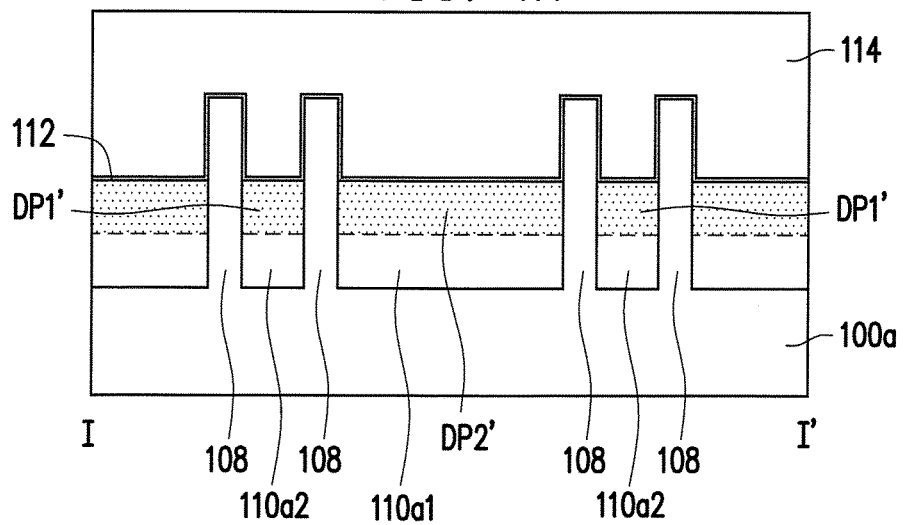

FIG. 4H is a perspective view of the FinFET at one of various stages of the manufacturing method, and FIG. 5H is a cross-sectional view of the FinFET taken along the cross-sectional line I-I' of FIG. 4H. In Step S60 in FIG. 1 and as shown in FIG. 4G to FIG. 4H and FIG. 5G to FIG. 5H, at least one dummy gate strip 114 is formed on the gate dielectric layer 112, and a pair of spacers 116 is then formed on the sidewalls of the dummy gate strip 114.

Figure 4I:
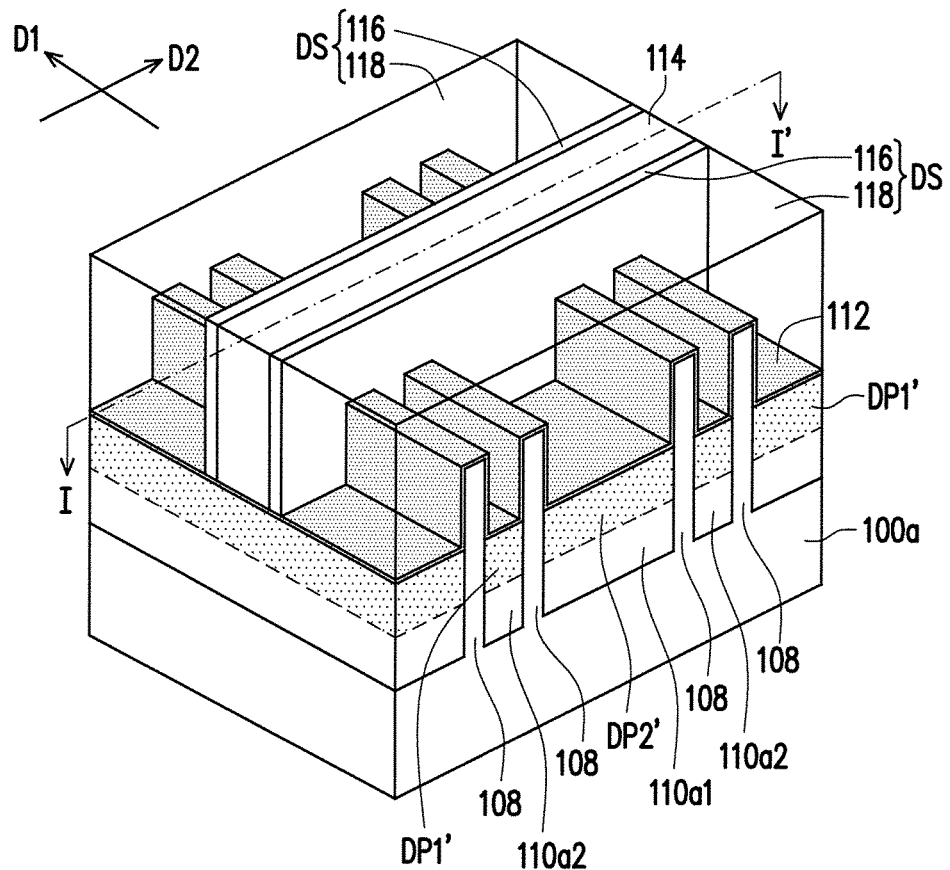
Figure 5I:
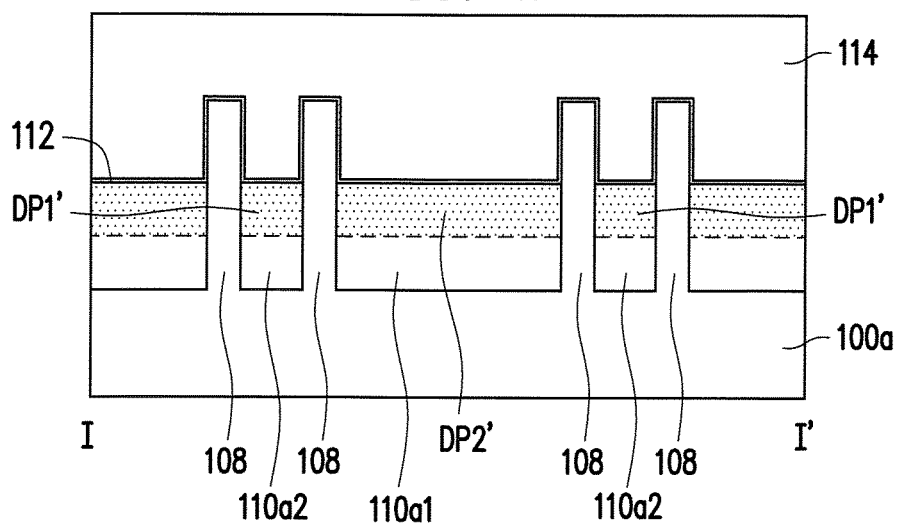

FIG. 4I is a perspective view of the FinFET at one of various stages of the manufacturing method, and FIG. 5I is a cross-sectional view of the FinFET taken along the cross-sectional line I-I' of FIG. 4I. In Step S60 in FIG. 1 and as shown in FIG. 4H to FIG. 4I and FIG. 5H to FIG. 5I, a patterned dielectric layer 118 is formed to cover the gate dielectric layer 112 that are not covered by the dummy gate strip 114 and the spacers 116.

As shown in FIG. 4I, the combination of the pair of spacers 116 and the patterned dielectric layer 118 may be considered as a dielectric structure DS adjacent to the dummy gate strip 114. In other words, the dummy gate strip 114 may be embedded in the dielectric structure DS, and the dielectric structure DS partially covers the semiconductor fins 108 and the insulators 110a.

In some embodiments, before the patterned dielectric layer 118 is formed, some processes (e.g., patterning process of gate dielectric layer 112, semiconductor fin recessing process, strained source/drain epitaxial process on the semiconductor fin, silicidation process, and so on) may be performed in advance. Details of the aforesaid optional processes are omitted.

Figure 4J:
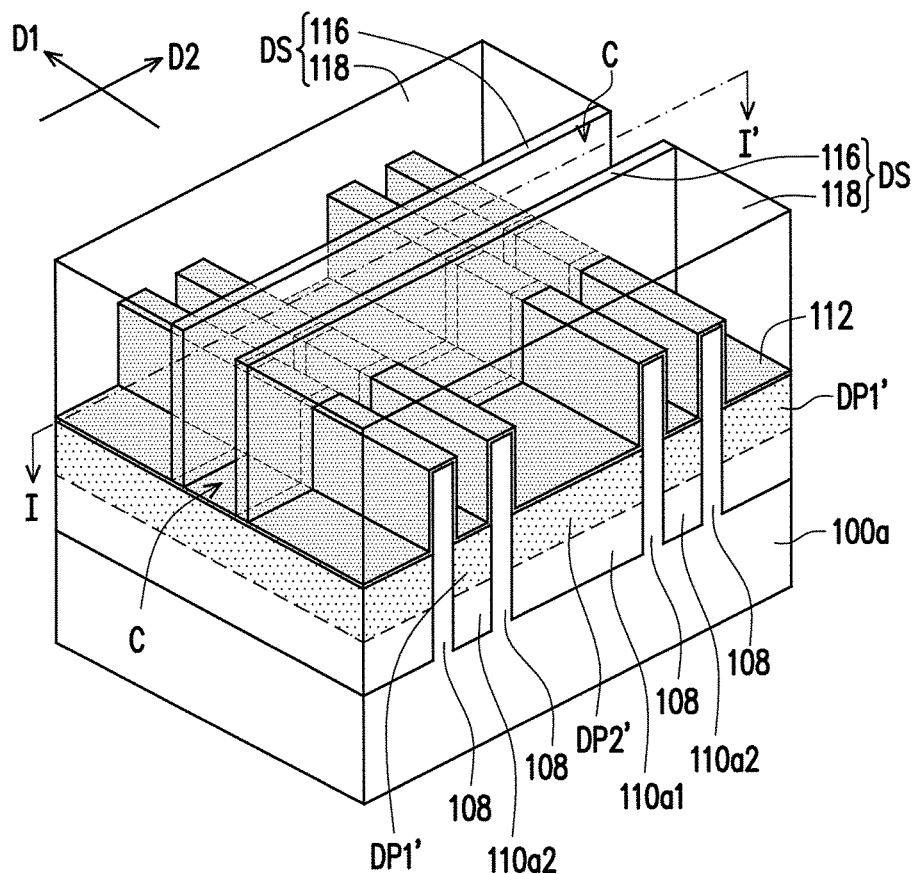
Figure 5J:
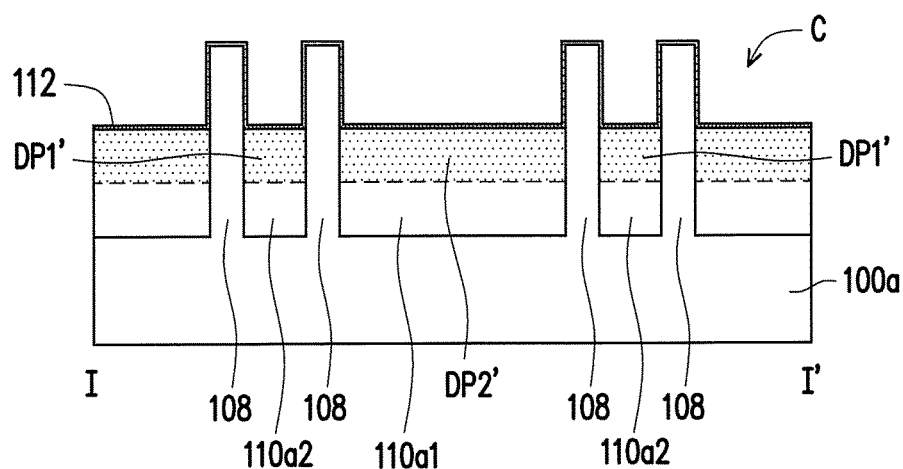
Figure 4K:
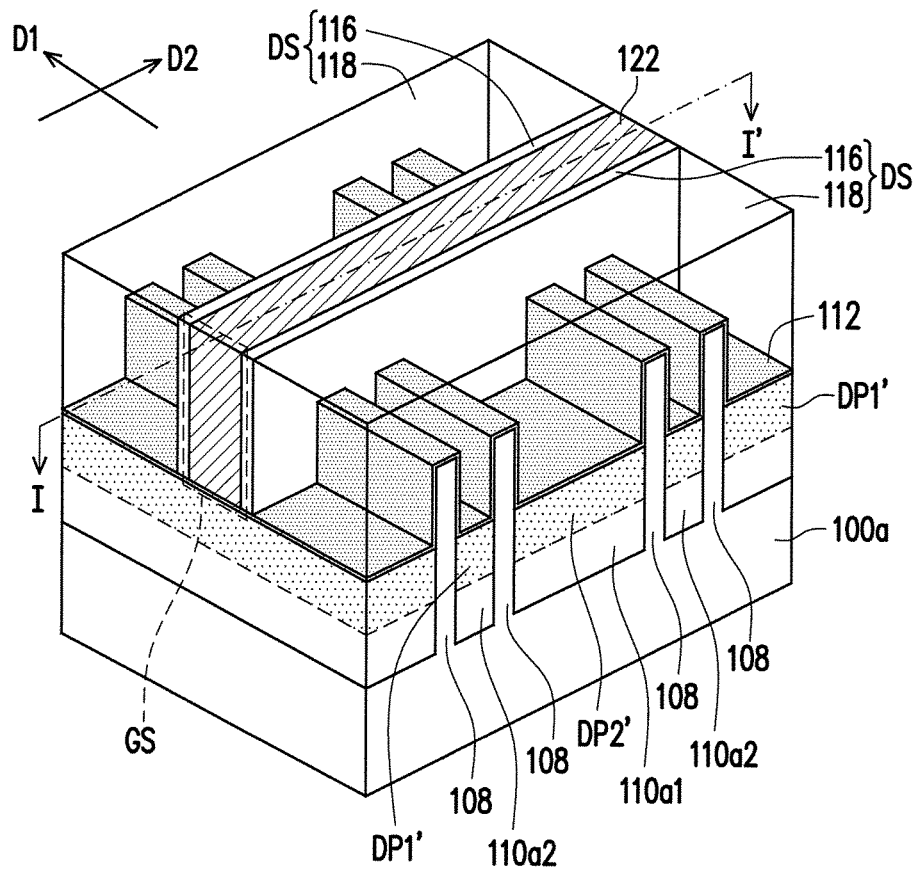
Figure 5K:
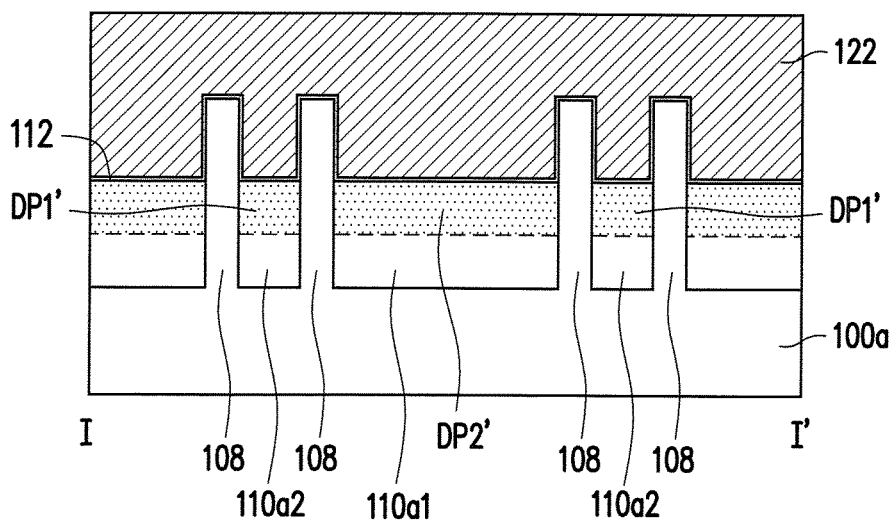

FIG. 4J and FIG. 4K are perspective views of the FinFET at various stages of the manufacturing method, and FIG. 5J and FIG. 5K are cross-sectional views of the FinFET taken along the cross-sectional line I-I' of FIG. 4J and FIG. 4K. In Step S60 in FIG. 1 and as shown in FIG. 4I to FIG. 4K and FIG. 5I to FIG. 5K, a gate replacement process is performed. In alternative embodiments, the above-illustrated gate replacement process (FIG. 4J through FIG. 4K and FIG. 5J through FIG. 5K) may be omitted.

Due to the formation of doped regions (DP', DP1', DP2') in the insulators (110a, 110a1, 110a2), the consumption or damage issue of the semiconductor fins 108 can be minimized. Furthermore, the cross-sectional profile of the semiconductor fins 108 can be properly controlled. Accordingly, performance, reliability, and yield rate of FinFETs may be enhanced.

In accordance with some embodiments of the present disclosure, a method for fabricating a fin field effect transistor (FinFET) comprising the following steps is provided. A substrate is patterned to form a plurality of trenches in the substrate and at least one semiconductor fin between the trenches. A dielectric layer is formed to fill the trenches and cover the at least one semiconductor fin. A plurality of doped regions is formed in the dielectric layer, and the doped regions are distributed in the trenches. The dielectric layer outside the trenches is removed. The doped regions in the trenches are partially removed to form a plurality of insulators in the trenches. A gate stack is formed to partially cover the at least one semiconductor fin and the insulators.

In accordance with alternative embodiments of the present disclosure, a method for fabricating a fin field effect transistor (FinFET) comprising the following steps is provided. A substrate is patterned to at least form a first trench, a second trench, and a plurality of semiconductor fins, the semiconductor fins are spaced apart by the first and second trenches, wherein an area occupied by the second trench is greater than an area occupied by the first trench. A dielectric layer is formed to fill the first and second trenches and cover the semiconductor fins. A first doped region and a second doped region are formed in the dielectric layer, wherein the first doped region contains a first dopant and is distributed in the first trench, and the second doped region at least contains a second dopant different from the first dopant and is distributed in the second trench. The dielectric layer outside the first and second trenches is removed by a planarization process. The first and second doped regions of the dielectric layer are partially etched to form a first insulator in the first trench and a second insulator in the second trench. A gate stack is formed to partially cover the semiconductor fins, the first and second insulators.

In accordance with yet alternative embodiments of the present disclosure, a fin field effect transistor (FinFET) comprising a substrate, a plurality of insulators, and a gate stack is provided. The substrate comprises a plurality of trenches and at least one semiconductor fin between the trenches. The insulators are disposed in the trenches and comprise doped regions distributed therein. The gate stack partially covers the at least one semiconductor fin and the insulators.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field effect transistor (FinFET), comprising:
    patterning a substrate to form a plurality of trenches in the substrate and at least one semiconductor fin between the trenches;
    forming a dielectric layer to fill the trenches and cover at least one semiconductor fin;
    forming a plurality of doped regions in the dielectric layer, wherein the doped regions are distributed in the trenches;
    removing the dielectric layer outside the trenches;
    partially removing the doped regions in the trenches to form a plurality of insulators in the trenches; and
    forming a gate stack to partially cover the at least one semiconductor fin and the insulators.

2. The method of claim 1, wherein the doped regions comprise a plurality of buried doped regions formed by at least one implantation process before the dielectric layer outside the trenches is removed.

3. The method of claim 1, wherein the doped regions comprise dielectric materials doped with boron (B), carbon (C), nitride (N), phosphorus (P), germanium (Ge), or a combination thereof.

4. The method of claim 1, wherein a method of removing the dielectric layer outside the trenches comprises a planarization process.

5. The method of claim 1, wherein a method of partially removing the doped regions of the dielectric layer comprises an etching process.

6. The method of claim 5, wherein an etch selectivity of the doped regions to the at least one semiconductor fin is greater than 60.

7. A method for fabricating a fin field effect transistor (FinFET), comprising:
    patterning a substrate to at least form a first trench, a second trench, and a plurality of semiconductor fins, the semiconductor fins being spaced apart by the first and second trenches, wherein an area occupied by the second trench is greater than an area occupied by the first trench;
    forming a dielectric layer to fill the first and second trenches and cover the semiconductor fins;
    forming a first doped region and a second doped region in the dielectric layer, wherein the first doped region contains a first dopant and is distributed in the first trench, the second doped region at least contains a second dopant different from the first dopant and is distributed in the second trench;
    removing the dielectric layer outside the first and second trenches by a planarization process;
    partially etching the first and second doped regions of the dielectric layer to form a first insulator in the first trench and a second insulator in the second trench; and
    forming a gate stack to partially cover the semiconductor fins, the first and second insulators.

8. The method of claim 7, wherein the first and second doped regions comprise a plurality of buried doped regions formed by implantation processes before the dielectric layer outside the first and second trenches is partially removed.

9. The method of claim 7, wherein the first dopant comprises dielectric materials doped with boron (B), carbon (C), nitride (N), phosphorus (P), germanium (Ge), or a combination thereof.

10. The method of claim 7, wherein the second dopant comprises dielectric materials doped with boron (B), carbon (C), nitride (N), phosphorus (P), germanium (Ge) or a combination thereof.

11. The method of claim 7, wherein the first doped region is formed in the dielectric layer before the dielectric layer outside the first and second trenches is removed, and the second doped region is formed in the dielectric layer after the dielectric layer outside the first and second trenches is removed.

12. The method of claim 7, wherein a method of forming a first doped region and a second doped region in the dielectric layer comprises:
    implanting the first dopant into the dielectric layer, wherein the first dopant is distributed in the first and second trenches; and
    implanting the second dopant into the dielectric layer, wherein the second dopant is distributed in the second trench, and the second doped region contains the first and second dopants.

13. The method of claim 7, wherein an etch selectivity of the first and second doped regions to the semiconductor fins is greater than 60.

* * * * *